United States Patent
McComb et al.

(10) Patent No.: US 8,937,976 B2
(45) Date of Patent: Jan. 20, 2015

(54) TUNABLE SYSTEM FOR GENERATING AN OPTICAL PULSE BASED ON A DOUBLE-PASS SEMICONDUCTOR OPTICAL AMPLIFIER

(75) Inventors: Timothy McComb, Portland, OR (US); Fabio Di Teodoro, Lawndale, CA (US)

(73) Assignee: Northrop Grumman Systems Corp., Falls Church, VA (US)

( * ) Notice: Subject to any disclaimer, the term of this patent is extended or adjusted under 35 U.S.C. 154(b) by 204 days.

(21) Appl. No.: 13/586,634

(22) Filed: Aug. 15, 2012

(65) Prior Publication Data
US 2014/0049810 A1    Feb. 20, 2014

(51) Int. Cl.
- H01S 3/102 (2006.01)
- H01S 5/00 (2006.01)
- H01S 5/40 (2006.01)

(52) U.S. Cl.
USPC .............................. 372/25; 359/344; 359/347

(58) Field of Classification Search
USPC ..................................... 359/344, 347; 372/25
See application file for complete search history.

(56) References Cited

U.S. PATENT DOCUMENTS

| | | | |
|---|---|---|---|
| 3,303,432 A | 2/1967 | Garfinkel et al. | 331/94.5 |
| 3,339,151 A | 8/1967 | Smith | 331/94.5 |
| 3,590,248 A | 6/1971 | Chatterton, Jr. | 250/199 |
| 3,622,906 A | 11/1971 | Nyul | 257/88 |
| 3,654,497 A | 4/1972 | Dyment et al. | 307/312 |
| 3,683,296 A | 8/1972 | Scalise | 331/94.5 |
| 3,771,031 A | 11/1973 | Kay | 317/235 R |
| 3,802,967 A | 4/1974 | Ladany et al. | 148/171 |
| 3,890,161 A | 6/1975 | Brown, III | 136/212 |
| 3,896,473 A | 7/1975 | DiLorenzo et al. | 357/15 |
| 3,958,263 A | 5/1976 | Panish et al. | 357/18 |
| 3,962,655 A | 6/1976 | Selway et al. | 331/945 H |
| 4,053,860 A | 10/1977 | Kozacka et al. | 337/164 |
| 4,057,101 A | 11/1977 | Ruka et al. | 165/1 |
| 4,092,614 A | 5/1978 | Sakuma et al. | 331/945 P |
| 4,136,435 A | 1/1979 | Li | 438/22 |
| 4,219,072 A | 8/1980 | Barlow | 165/32 |
| 4,228,406 A | 10/1980 | Lewis et al. | 331/945 D |

(Continued)

FOREIGN PATENT DOCUMENTS

| | | | |
|---|---|---|---|
| DE | 4315580 | 11/1994 | H01S 3/43 |
| DE | 10328440 | 1/2005 | H01S 5/042 |

(Continued)

OTHER PUBLICATIONS

International Search Report for International Application No. PCT/US2013/049876, Mailed Dec. 16, 2013, (2 pp).

(Continued)

Primary Examiner — Eric Bolda
(74) Attorney, Agent, or Firm — Nixon Peabody LLP

(57) ABSTRACT

A system for generating a shaped optical pulse is disclosed. The system includes a master oscillator for generating an initial optical pulse, which is then directed to a semiconductor optical amplifier to amplify a portion of the initial optical pulse. The amplified pulse is reflected from a fiber Bragg grating to spectrally clean the amplified pulse and the reflected portion is returned back through the semiconductor optical amplifier. The semiconductor optical amplifier is activated a second time to amplify the reflected portion of the pulse. The time delay between the two activations of the semiconductor optical amplifier is selected to generate an output pulse with desired duration and/or amplitude profile over time.

6 Claims, 11 Drawing Sheets

(56) References Cited

U.S. PATENT DOCUMENTS

| | | | | |
|---|---|---|---|---|
| 4,233,567 | A | 11/1980 | Chernoch | 331/945 P |
| 4,315,225 | A | 2/1982 | Allen, Jr. et al. | 372/35 |
| 4,383,270 | A | 5/1983 | Schelhorn | 357/71 |
| 4,393,393 | A | 7/1983 | Allen, Jr. et al. | 357/81 |
| 4,415,234 | A | 11/1983 | Myers | 350/310 |
| 4,454,602 | A | 6/1984 | Smith | 372/36 |
| 4,573,067 | A | 2/1986 | Tuckermann et al. | 357/82 |
| 4,617,585 | A | 10/1986 | Yasui | 357/72 |
| 4,673,030 | A | 6/1987 | Basiulis | 165/32 |
| 4,709,750 | A | 12/1987 | White | 165/10 |
| 4,716,568 | A | 12/1987 | Scifres et al. | 372/36 |
| 4,730,324 | A | 3/1988 | Azad | 372/33 |
| 4,742,577 | A | 5/1988 | Valdmanis | |
| 4,782,222 | A | 11/1988 | Ragle et al. | 250/211 J |
| 4,831,629 | A | 5/1989 | Paoli et al. | 372/50 |
| 4,837,768 | A | 6/1989 | Schmid | 372/36 |
| 4,847,848 | A | 7/1989 | Inoue et al. | 372/50 |
| 4,852,109 | A | 7/1989 | Kuchar | 372/34 |
| 4,877,641 | A | 10/1989 | Dory | 427/38 |
| 4,881,233 | A | 11/1989 | von Arb et al. | 372/35 |
| 4,881,237 | A | 11/1989 | Donnelly | 372/50 |
| 4,899,204 | A | 2/1990 | Rosen et al. | 357/30 |
| 4,901,330 | A | 2/1990 | Wolfram et al. | 372/75 |
| 4,949,346 | A | 8/1990 | Kuper et al. | 372/36 |
| 4,963,741 | A | 10/1990 | McMullin | 250/338 |
| 4,975,923 | A | 12/1990 | Buus et al. | 372/50 |
| 5,001,355 | A | 3/1991 | Rosen et al. | 250/551 |
| 5,005,640 | A | 4/1991 | Lapinski et al. | 165/170 |
| 5,022,042 | A | 6/1991 | Bradley | 372/75 |
| 5,031,187 | A | 7/1991 | Orenstein et al. | 372/50 |
| 5,040,187 | A | 8/1991 | Karpinski | 372/50 |
| 5,073,838 | A | 12/1991 | Ames | 361/103 |
| 5,076,348 | A | 12/1991 | Bluege | 165/902 |
| 5,084,888 | A | 1/1992 | Tajima et al. | 372/39 |
| 5,099,214 | A | 3/1992 | Rosen et al. | 333/157 |
| 5,099,487 | A | 3/1992 | Rickey et al. | 375/35 |
| 5,099,488 | A | 3/1992 | Ahrabi et al. | 372/361 |
| 5,105,429 | A | 4/1992 | Mundinger et al. | 372/34 |
| 5,115,445 | A | 5/1992 | Mooradian | 372/75 |
| 5,128,951 | A | 7/1992 | Karpinski | 372/50 |
| 5,156,999 | A | 10/1992 | Lee | 437/215 |
| 5,163,064 | A | 11/1992 | Kim et al. | 372/50 |
| 5,212,699 | A | 5/1993 | Masuko et al. | 372/50 |
| 5,216,263 | A | 6/1993 | Paoli | 257/88 |
| 5,216,688 | A | 6/1993 | Kortz et al. | 372/75 |
| 5,220,954 | A | 6/1993 | Longardner et al. | 165/10 |
| 5,253,260 | A | 10/1993 | Palombo | 372/34 |
| 5,265,113 | A | 11/1993 | Halldórsson et al. | 372/36 |
| 5,284,790 | A | 2/1994 | Karpinski | 437/129 |
| 5,287,375 | A | 2/1994 | Fujimoto | 372/38 |
| 5,305,344 | A | 4/1994 | Patel | 372/36 |
| 5,311,535 | A | 5/1994 | Karpinski | 372/50 |
| 5,311,536 | A | 5/1994 | Paoli et al. | 372/50 |
| 5,315,154 | A | 5/1994 | Elwell | 257/707 |
| 5,323,411 | A | 6/1994 | Shirasaka et al. | 372/43 |
| 5,325,384 | A | 6/1994 | Herb et al. | 370/13 |
| 5,337,325 | A | 8/1994 | Hwang | 372/36 |
| 5,351,259 | A | 9/1994 | Ishimori et al. | 372/75 |
| 5,388,755 | A | 2/1995 | Baxter | 228/123.1 |
| 5,394,426 | A | 2/1995 | Joslin | 372/50 |
| 5,394,427 | A | 2/1995 | McMinn et al. | 372/70 |
| 5,402,436 | A | 3/1995 | Paoli | 372/50 |
| 5,402,437 | A | 3/1995 | Mooradian | 372/92 |
| 5,438,580 | A | 8/1995 | Patel et al. | 372/33 |
| 5,475,349 | A | 12/1995 | Cohn | 333/218 |
| 5,485,482 | A | 1/1996 | Selker et al. | 372/75 |
| 5,495,490 | A | 2/1996 | Rice et al. | 372/34 |
| 5,520,244 | A | 5/1996 | Mundinger et al. | 257/712 |
| 5,526,373 | A | 6/1996 | Karpinski | 372/101 |
| 5,548,603 | A | 8/1996 | Calvani et al. | |
| 5,550,852 | A | 8/1996 | Patel et al. | 372/33 |
| 5,663,979 | A | 9/1997 | Marshall | 372/103 |
| 5,715,264 | A | 2/1998 | Patel et al. | 372/36 |
| 5,734,672 | A | 3/1998 | McMinn et al. | 372/50 |
| 5,745,514 | A | 4/1998 | Patel et al. | 372/43 |
| 5,761,234 | A | 6/1998 | Craig et al. | 372/75 |
| 5,764,675 | A | 6/1998 | Juhala | 372/50 |
| 5,834,840 | A | 11/1998 | Robbins et al. | 275/705 |
| 5,835,515 | A | 11/1998 | Huang | 372/36 |
| 5,835,518 | A | 11/1998 | Mundinger et al. | 372/50 |
| 5,898,211 | A | 4/1999 | Marshall et al. | 257/601 |
| 5,903,583 | A | 5/1999 | Ullman et al. | 372/35 |
| 5,913,108 | A | 6/1999 | Stephens et al. | 438/109 |
| 5,985,684 | A | 11/1999 | Marshall et al. | 438/26 |
| 5,987,043 | A | 11/1999 | Brown et al. | 372/36 |
| 6,018,602 | A | 1/2000 | Mayor et al. | 385/27 |
| 6,026,109 | A | 2/2000 | Micke et al. | 372/92 |
| 6,061,378 | A | 5/2000 | Marshall et al. | 372/75 |
| 6,192,058 | B1* | 2/2001 | Abeles | 372/6 |
| 6,245,307 | B1 | 6/2001 | Inui et al. | 423/231.5 |
| 6,266,353 | B1 | 7/2001 | Freitas et al. | 372/36 |
| 6,272,159 | B1 | 8/2001 | Garcia | 372/36 |
| 6,307,871 | B1 | 10/2001 | Herberle | 372/34 |
| 6,310,900 | B1 | 10/2001 | Stephens et al. | 372/36 |
| 6,317,443 | B1 | 11/2001 | Craig et al. | 372/38.04 |
| 6,351,478 | B1 | 2/2002 | Herberle | 372/36 |
| 6,352,873 | B1 | 3/2002 | Hoden | 438/28 |
| 6,356,574 | B1 | 3/2002 | Craig et al. | 372/75 |
| 6,397,618 | B1 | 6/2002 | Chu et al. | 622/592 |
| 6,480,514 | B1 | 11/2002 | Lorenzen et al. | 372/35 |
| 6,498,385 | B1 | 12/2002 | Daubenspeck et al. | 257/529 |
| 6,570,895 | B2 | 5/2003 | Heberle | 622/592 |
| 6,580,150 | B1 | 6/2003 | Metzler | 257/594 |
| 6,603,498 | B1 | 8/2003 | Konnumaho et al. | 347/236 |
| 6,636,538 | B1 | 10/2003 | Stephens | 257/675 |
| 6,728,275 | B2 | 4/2004 | Stephens et al. | 372/36 |
| 6,791,181 | B2 | 9/2004 | Horie et al. | 257/706 |
| 6,859,472 | B2 | 2/2005 | Betin et al. | 372/35 |
| 6,919,525 | B2 | 7/2005 | Pinneo | 257/675 |
| 7,046,349 | B2* | 5/2006 | Everall et al. | 356/73.1 |
| 7,190,706 | B2 | 3/2007 | McColloch | 372/34 |
| 7,262,467 | B2 | 8/2007 | Kelbertau | 257/355 |
| 7,443,893 | B2 | 10/2008 | Murison et al. | 372/26 |
| 7,680,171 | B2 | 3/2010 | Yamamoto et al. | 372/50.12 |
| 7,817,682 | B2 | 10/2010 | Murison et al. | 372/6 |
| 2002/0018498 | A1 | 2/2002 | Heberle | 372/35 |
| 2002/0170747 | A1 | 11/2002 | Chu et al. | 174/256 |
| 2003/0142711 | A1 | 7/2003 | Treusch et al. | 372/36 |
| 2003/0201530 | A1 | 10/2003 | Kurihara et al. | 257/712 |
| 2004/0113056 | A1* | 6/2004 | Everall et al. | 250/227.23 |
| 2004/0179791 | A1 | 9/2004 | Robert et al. | 385/88 |
| 2004/0202216 | A1 | 10/2004 | Fairgrieve | 372/38.07 |
| 2004/0247005 | A1 | 12/2004 | Schrodinger et al. | 372/38.1 |
| 2005/0018726 | A1 | 1/2005 | Dinger et al. | 372/36 |
| 2005/0051891 | A1 | 3/2005 | Yoshida et al. | 257/720 |
| 2005/0094688 | A1 | 5/2005 | Scofet et al. | 372/36 |
| 2006/0045154 | A1 | 3/2006 | Linares | 372/36 |
| 2006/0108098 | A1 | 5/2006 | Stevanovic et al. | 165/80.4 |
| 2006/0203866 | A1 | 9/2006 | Stephens, IV | 372/43.01 |
| 2007/0053391 | A1 | 3/2007 | Oron | |
| 2007/0153847 | A1 | 7/2007 | Faircloth et al. | 372/35 |
| 2008/0025357 | A1 | 1/2008 | Coleman et al. | 372/36 |
| 2008/0094841 | A1 | 4/2008 | Dahm | 362/294 |
| 2008/0181266 | A1* | 7/2008 | Deladurantaye et al. | 372/25 |
| 2008/0267234 | A1 | 10/2008 | Scofet et al. | 372/36 |
| 2009/0147808 | A1 | 6/2009 | Murison et al. | 372/20 |
| 2009/0262767 | A1 | 10/2009 | Thiagarajan et al. | 372/34 |
| 2009/0296759 | A1* | 12/2009 | Starodoumov | 372/25 |
| 2010/0128744 | A1 | 5/2010 | Deladurantaye et al. | 372/6 |
| 2011/0002691 | A1 | 1/2011 | Lin | |
| 2011/0032605 | A1* | 2/2011 | Kliner et al. | 359/344 |
| 2011/0243153 | A1 | 10/2011 | Murison et al. | |
| 2012/0281199 | A1 | 11/2012 | Thielen et al. | 356/4.01 |

FOREIGN PATENT DOCUMENTS

| | | | |
|---|---|---|---|
| EP | 0 458 469 | 11/1991 | |
| EP | 0 550 996 | 7/1993 | |
| EP | 0 634 822 | 1/1995 | H01L 33/48 |
| EP | 0 805 527 | 11/1997 | H01S 5/02 |
| EP | 0 833 419 | 4/1998 | H01L 27/15 |
| EP | 1 187 196 | 3/2002 | H01L 23/02 |
| JP | 55-65450 | 5/1980 | H01L 23/30 |
| JP | 59-103565 | 6/1984 | H02M 1/08 |

(56) References Cited

FOREIGN PATENT DOCUMENTS

| JP | 60-211992 | 10/1985 | ............... H01S 3/18 |
|---|---|---|---|
| JP | 01123493 | 5/1989 | ............... H01S 3/18 |
| JP | 02281782 | 11/1990 | ............... H01S 3/18 |
| JP | 3-6875 | 1/1991 | ............... H01S 3/18 |
| JP | 03016290 | 1/1991 | ............... H01S 3/18 |
| JP | 3-269325 | 3/1991 | ............... H01S 3/18 |
| JP | 4-359207 | 6/1991 | ............... H01S 3/18 |
| JP | 04-023381 | 1/1992 | ............... H01S 3/18 |
| JP | 04-314375 | 11/1992 | ............... H01S 3/18 |
| JP | 6-13717 | 1/1993 | ............... H01S 3/18 |
| JP | 2002-025784 | 1/2002 | ............. H05B 37/03 |
| JP | 2002-353551 | 12/2002 | ............. H01S 5/024 |
| JP | 2004-146720 | 5/2004 | ............. H01S 5/024 |
| JP | 2004-356429 | 12/2004 | ............. H01S 5/022 |
| JP | 2006-032406 | 2/2006 | ............. H01S 5/022 |
| WO | WO 96/28846 | 9/1996 | ............ H01L 23/427 |
| WO | WO 00/59086 | 10/2000 | ............... H01S 5/40 |
| WO | WO 03/075423 | 9/2003 | ............. H01S 5/068 |
| WO | WO 2004/062051 | 7/2004 | ............. H01S 5/026 |
| WO | WO 2006/006455 | 1/2006 | ............. H01S 5/024 |

OTHER PUBLICATIONS

Written Opinion of the International Searching Authority for International Application No. PCT/US2013/049876, Mailed Dec. 16, 2013 (8 pp).
Advancing Microelectronics Catalog, vol. 32, No. 3, May/Jun. 2005 (40 pages).
Ahearn, W.E., "Thermal Spacer for Room Temperature Close-Packed GaAs Laser Arrays," IBM Technical Disclosure Bulleting, vol. 12, No. 12, p. 2311, May 1970.
Aljada et al., "A Tunable Multiwavelength Laser Employing a Semiconductor Optical Amplifier and an Opto-VLSI Processor," IEEE Photonics Technology Letters, vol. 20, No. 10, pp. 815-817, May 15, 2008.
Article, "Analysis of Substrates for Single Emitter Laser Diodes," Tapani M. Alander et al., Institute of Electronics, Sep. 2003, vol. 125, pp. 313-318 (6 pages).
B. Welber, Heat Sink for High Powered Injection Lasers, IBM Technical Disclosure Bulletin, (Sep. 1965) (2 pages).
Coherent Laser Group, Laser Diodes and Bars (article) (5 pages). Date unknown.
Dirk Lorenzen et al., Micro Thermal Management of High-Power Diode Laser Bars, IEEE Transactions on Industrial Electronics, vol. 48, No. 2 (Apr. 2001) (12 pages).
Endriz, John G. "High Power Diode Laser Arrays," IEEE Journal of Quantum Electronics, No. 4, pp. 952-965, Apr. 1992 (14 pages).
Girard et al., "Frequency-Modulated, Tuanble, Semiconductor-Optical-Amplifier-Based Fiber Ring Laser for Linewidth and Line Shape Control," Optics Letters, vol. 33, No. 16, pp. 1920-1922, Aug. 15, 2008.
Han et al., "Continuously Spacing-Tunable Multiwavelength Semiconductor-Optical-Amplifier-Based Fiber Ring Laser Incorporating a Superimposed Chirped Fiber Bragg Grating," Optics Letters, vol. 32, No. 9, pp. 1032-1034, May 1, 2007.
Harun, "Tunable and Low Noise Gain-Clamped Double-Pass L-Band Erbium-Doped Fiber Amplifier," Japanese Journal of Applied Physics, Jul. 23, 2004, pp. L1075-L1077.
IBM Corp. "Circuit Module Cooling With Multiple Pistons Contacting a Heat Spreader/Electrical Buffer Plate in Contact With Chip," IBM Technical Disclosure Bulletin, vol. 31, No. 12, pp. 5-7, May 1989 (2 pages).
IBM Corp. "Heat Sink Assembly for Tab-Mounted Devices," IBM Technical Disclosure Bulletin, vol. 31, No. 6, pp. 372-373, Nov. 1988 (2 pages).
Jeon et al., "Tunable Ring Laser Based on a Semiconductor Optical Amplifier at 1300 nm Using a Simple Wavelength Selection Filter," Microwave and Optical Technology Letters, vol. 50, No. 5, pp. 1317-1320, May 2008.
Kumavor and Donkor, "Passively Modelocked Laser with Tunable Pulse Repetition Frequency in a Semiconductor Optical Amplifier," IEEE Journal of Quantum Electronics, pp. 865-869, Jun. 2011.
Michael Leers et al., Expansion-Matched Passively Cooled Heatsinks With Low Thermal Resistance for High Power Diode Laser Bars, Proceedings of the SPIE, vol. 6104, 20-29 (Feb. 2006) (10 pages).
Mundinger, D. High Average Power Edge Emitting Laser Diode Arrays on Silicon Microchannel Coolers, Nov. 19, 1990 (2 pages).
PCT International Search Report for International Application No. PCT/US2007/016517 mailed on Dec. 4, 2008 (4 pages).
PCT International Search Report for International Application No. PCT/US2007/016740 mailed on Feb. 1, 2008 (5 pages).
PCT International Written Opinion for International Application No. PCT/US2007/016517 mailed on Dec. 4, 2008 (7 pages).
Peter Z. Shi, K.M. Chua, Stephen C.K. Wong, & Y.M. Tan, Design and Performance Optimization of Miniature Heat Pipes in LTCC, Journal of Physics: Conference Series Institute of Physics Publishing, Bristol, GB, vol. 34, No. 1, 142-147 (Apr. 1, 2006) (6 pages).
Roh et al., "Channel-Spacing and Wavelength-Tunable Multiwavelength Fiber Ring Laser Using Semiconductor Optical Amplifier," IEEE Photonics Technology Letters, vol. 18, No. 21, pp. 2302-2304, Nov. 1, 2006.
Sergey K. Gordeev et al., SiC-Skeleton Cemented Diamond A Novel Engineering Material With Unique Properties, Ceramic Engineering and Science Proceedings, vol. 21, No. 3, 753-760 (2000) (8 pages).
Thomson CSF Semiconducteurs Specifiques, Package Specification (schematic), p. 3 (one page). Date unknown.
Tseng et al., "Stable Tunable Single-Longitudinal-Mode Semiconductor Optical Amplifier Erbium-Doped Fiber Ring Lasers for 10 Gbps Transmission over 50 km Single-Mode Fiber," Optica Applicata, vol. XL, No. 4, pp. 927-932, 2010.
V. Glaw, R. Hahn, A. Paredes, U. Hein, O. Ehrmann, H. Reichl; 1997 International Symposium on Advanced Packaging Materials, Laser Machining of Ceramics Silicon for MCM-D Applications,(1997) (4pages).
Yi et al., "Tunable Gain-Clamped Double-Pass Erbium-Doped Fiber Amplifier," Optics Express, Jan. 23, 2006, pp. 570-574.

* cited by examiner

TUNABLE SYSTEM FOR GENERATING AN OPTICAL PULSE BASED ON A DOUBLE-PASS SEMICONDUCTOR OPTICAL AMPLIFIER

TECHNICAL FIELD

The invention relates generally to a tunable system for generating an optical pulse and more particularly to a tunable system for generating an optical pulse based on a double-pass semiconductor optical amplifier.

BACKGROUND

Optical signals can be generated via laser systems that produce coherent stimulated emission in response to electrical input driver signals. The magnitude or intensity of optical signals generated via laser systems are typically characterized by temporal variations including a ramp time the optical cavity initially achieves stability, and a tail time while the optical cavity ceases to emit optical signals following turn off of the driver signals. Laser-generated optical signals are employed in various fields including communication systems that employ optical signals conveyed via fiber optic connections to transmit embedded information. To achieve high bit rates in such communication links, it is often desired to use fast optical pulses with adjustable amplitude versus time profiles. High efficiency pulse shaping can assist in forming ultra short bit streams to be transmitted as short bursts of light allowing an increase in the data transfer rate. Pulse shaping may also play a role in ultra fast optical switching filtering and amplification.

Optical amplifiers are devices employed in optical communications to amplify an incoming optical signal and output the amplified signal. Some optical amplifiers are operated by control signals that activate or deactivate semiconductor elements within the optical amplifier to allow the semiconductor optical amplifier to provide gain to an incoming optical signal, and output the amplified signal, according to control signals.

The generation of sub nanosecond optical pulses with controllable duration is a difficult laser engineering problem. For example, passively q-switched solid-state lasers (e.g. microchip lasers) emit pulses of duration in the 500-1000 ps window, but the pulse duration is not adjustable and cannot be adjusted to a smaller duration due to limitations inherent in the pulse formation dynamics. In actively q-switched lasers the pulsewidth can be controlled to some extent, but the pulse duration is longer (typically >1 ns).

Gain-switched diode lasers generate optical pulses of arbitrary duration according to a driving electric signal. However, these lasers must be driven by peak currents close to 1 ampere to be of practical use and the generation of fast, sub-nanosecond current transients of this magnitude is an extremely challenging electronics design problem.

Semiconductor lasers can be driven in the "gain-switch spike" mode, in which the laser is barely pushed above threshold and then the emission is quickly truncated after the first relaxation oscillator. However, the gain switch spike is <100 ps long, its duration uncontrollable, and the emitted power is very low and of limited use. Mode-locking typically results in shorter (tens of picoseconds or shorter) and not adjustable pulse durations, usually at very high pulse repetition rates (~1 MHz or greater).

Intracavity spectral filters and pulse pickers can be employed to obtain longer pulses or lower repetition rates, respectively, but such devices tend to greatly increase complexity while offering only modest pulse control. Semiconductor optical amplifiers are, in principle, better modulators: they provide optical gain rather than loss, exhibit very high and stable pulse contrast (>50 dB), and do not suffer from photorefractive damage. However, because of carrier lifetime, the shortest pulses that can be generated via semiconductor optical amplifiers are typically greater than 2 nanoseconds.

SUMMARY

The present disclosure includes an arrangement for an optical pulse shaper that receives an input from a master oscillator and outputs a shaped optical pulse. A master oscillator generates an initial optical pulse, which is then directed to a semiconductor optical amplifier to amplify a portion of the initial optical pulse. The amplified pulse is reflected from a fiber Bragg grating to spectrally clean the amplified pulse and the reflected portion is returned back through the semiconductor optical amplifier. The semiconductor optical amplifier is activated a second time to amplify the reflected portion of the pulse. The time delay between the two activations of the semiconductor optical amplifier is selected to generate an output pulse with desired duration and/or amplitude profile over time.

Some embodiments of the present disclosure include a system for generating a shaped optical pulse. The system can include an optical circulator, a semiconductor optical amplifier, and a fiber Bragg grating. The optical circulator is for receiving a first optical pulse. The semiconductor optical amplifier is optically connected to the optical circulator to receive the first optical pulse. The semiconductor optical amplifier is configured so as to amplify at least a portion of the received first optical pulse and output a first amplified pulse. The fiber Bragg grating is optically connected to the semiconductor optical amplifier for selectively reflecting the first amplified pulse to the semiconductor optical amplifier. The semiconductor optical amplifier receives the reflected first amplified pulse from the fiber Bragg grating and amplifies at least a portion of the reflected first amplified pulse so as to create a second amplified optical pulse. The second amplified output is received by the optical circulator and outputted from the optical circulator as the shaped optical pulse.

Some embodiments of the present disclosure include a method of generating a shaped optical pulse. The method includes generating a first optical pulse via a master oscillator. The method includes activating, at a first time, a semiconductor optical amplifier receiving the first optical pulse so as to amplify at least a portion of the first optical pulse and thereby produce a first amplified pulse. The method includes reflecting the first amplified pulse from a reflector such that a spectrally characterized reflected pulse is produced. The method includes activating, at a second time, the semiconductor optical amplifier so as to amplify at least a portion of the spectrally characterized reflected pulse and thereby produce the shaped optical pulse.

Additional aspects of the invention will be apparent to those of ordinary skill in the art in view of the detailed description of various embodiments, which is made with reference to the drawings, a brief description of which is provided below.

Figure 1:
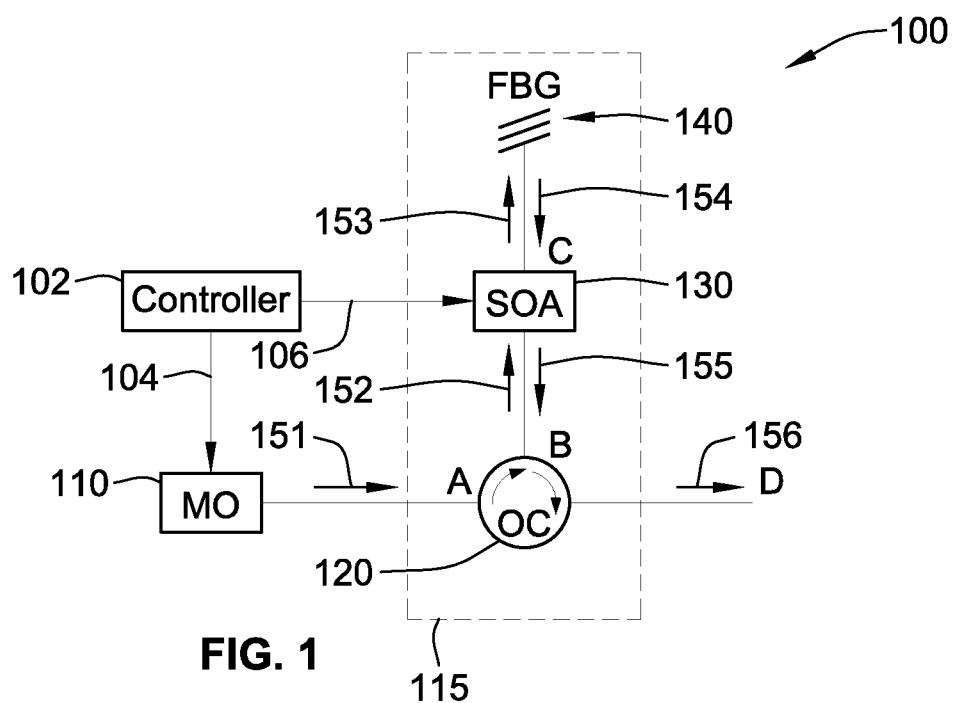
FIG. 1 is a block diagram of a system for generating an optical pulse via two passes through a semiconductor optical amplifier.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 is a block diagram of a system 100 for generating an optical pulse via two passes through a semiconductor optical amplifier 130. The configuration of FIG. 1 providing two passes through a semiconductor optical amplifier is alternatively referred to herein as a double-pass semiconductor optical amplifier configuration. The system 100 includes a master oscillator 110 configured to generate and output an optical pulse. The master oscillator 110 is optically connected to a pulse shaper 115. The pulse shaper 115 includes an optical circulator 120, a semiconductor optical amplifier 130, and a fiber Bragg grating 140. Generally, the optical circulator 120 directs an incoming pulse to the semiconductor optical amplifier 130, where the pulse is at least partially amplified. The amplified pulse is then reflected from a fiber Bragg grating 140 such that the reflected pulse has spectral characteristics specified by the fiber Bragg grating 140, and the selectively reflected pulse passes back through the semiconductor optical amplifier 120 before being directed to an output by the optical circulator 120. Both the optical circulator 120 and fiber Bragg grating 140 can be passive optical components while the master oscillator 110 and the semiconductor optical amplifier 130 are active components driven by control signals 104, 106 from a controller 102. As described below, output from the pulse shaper 115 is controlled by timing the control signals 106 operating the semiconductor optical amplifier 130.

In the drawings, the optical devices in the system 100 are labeled with abbreviations for convenience. In particular, the master oscillator 110 is labeled "MO", the optical circulator 120 is labeled "OC", the semiconductor optical amplifier is labeled "SOA", and the fiber Bragg grating is labeled "FBG".

The master oscillator 110 can be a distributed feedback master oscillator, a distributed Bragg reflector diode, and/or a solid state optical device, such as a laser diode. The system 100 can operate with optical pulses from the master oscillator at a variety of different wavelengths, and thus a variety of different lasing mediums. For example, the optical pulse output from the master oscillator 110 can have a wavelength of approximately 980 nm, approximately 1064 nm, approximately 1083 nm, etc. The master oscillator 110 can optionally be a distributed Bragg reflector laser manufactured by EM4, Inc. of Bedford, Mass.

The master oscillator 110 is actively gain-switched and is electronically driven. For example, the master oscillator 110 can be driven by the control signals 104 from the controller 102. The master oscillator 110 generates and outputs an optical pulse 151, which typically has a pulse duration between approximately 10 nanoseconds and approximately 50 nanoseconds. The initial portion of the generated pulse generally exhibits a relatively greater amount of spectral and/or amplitude temporal variations as compared to the tail portion of the generated pulse 151 once the transients have relaxed. Thus, the tail end of the pulse 151 generally exhibits a greater degree of spectral and/or amplitude coherency and/or uniformity than the initial portion of the pulse 151 immediately following turn-on of the master oscillator 110. Accordingly, the tail end of the pulse 151, is temporally stable with respect to amplitude and spans a relatively narrow range of wavelengths.

The optical circulator 120 has three ports, which are labeled in FIG. 1 as A, B, and D. The optical circulator 120 is a device configured to receive optical signals in at one port, and pass the signals to the next port over, in a circular fashion. That is, optical signals received at port A are output from port B, and similarly optical signals received at port B are output from port D. The direction of the circulation (e.g., from port A to B, and from B to D) is indicated in FIG. 1 by the rotating arrow on the optical circulator 120. In some examples described herein, port A is alternatively referred to as an input port, port D is alternatively referred to as an output port, and port B is alternatively referred to as an intermediate port. The optical circulator 120 thus allows for receiving the initial pulse 151 from the master oscillator 110 via port A, conveying the pulse to the additional components of the pulse shaper 115 (e.g., the semiconductor optical amplifier 130 and fiber Bragg grating 140) via port B, and directing a returning pulse 156 to the output via port D.

The semiconductor optical amplifier 130 is an active device driven to amplify incoming optical signals and output the amplified optical signal according to electronic control signals 106. The semiconductor optical amplifier 130 includes a semiconductive gain medium that is electronically pumped by the control signals 106 to amplify incoming optical energy. The semiconductor optical amplifier 130 can be, for example, a quantum dot semiconductor optical amplifier manufactured by Innolume GmbH of Dortmund, Germany. The semiconductor optical amplifier 130 provides gain of approximately 30 dB, and exhibits low leakage, such that output from the semiconductor optical amplifier 130 while the semiconductor optical amplifier 130 is turned off, even while receiving incoming optical signals, approaches the noise floor of the optical system. Thus, the semiconductor optical amplifier 130 can be configured with a contrast ratio (i.e., the difference between the output while turned on versus the output while turned off) sufficient to prevent amplified optical noise from influencing downstream components in the system 100.

The semiconductor optical amplifier 130 modifies an incoming optical pulse 152 to a first amplified pulse 153. The time overlap between the amplification window of the semiconductor optical amplifier 130 (duration while the amplifier 130 is tuned on) and the incoming optical pulse 152 can be continuously adjusted via the control signals 106 from the controller 102. In some examples, the controller 102 can include a delay generator and can optionally be integrated within the semiconductor optical amplifier 130. The amplified portion of the incoming optical pulse 152 is that portion that falls within the amplification window of the semiconductor optical amplifier 130, which typically is approximately 2 nanoseconds in duration. Accordingly, an amplified pulse 153 with a duration corresponding to the duration of the amplification window of the semiconductor optical amplifier is generated by the control signals 106 to control the operation of the semiconductor optical amplifier 130.

The control signals 106 are timed such that the semiconductor optical amplifier 130 is electronically driven to carve out and amplify a portion of the tail end of the incoming optical pulse 152, generating and outputting a first amplified pulse 153. Because the first amplified pulse 153 is amplified from the tail end of the incoming pulse 152, rather than the initial portion, the first amplified pulse 153 is substantially free of any initial spectral and/or amplitude transient effects in the pulse 151. Thus, the timing of the initial turn on time of the semiconductor optical amplifier 130 to generate the first amplified pulse 153 can be chosen to selectively amplify portions of the incoming pulse 152 with desirable spectral and/or amplitude variation characteristics.

The temporal profile of the amplitude of the first amplified pulse 153 exhibits a rise time (e.g., duration from approximately zero output signal to approximately maximum output signal) that corresponds to the responsiveness of the semiconductor optical amplifier 130. Semiconductor optical amplifiers 130 can achieve typical rise times between approximately 0.1 nanosecond and approximately 1.0 nanosecond. The temporal profile of the first amplified pulse 153 exhibits a greater fall time (e.g., duration from approximately maximum output signal to approximately zero output). Typical fall times between approximately 1 nanosecond and approximately 3 nanoseconds are observed. The rise time is driven by stimulated emission, whereas the fall time is due to the lifetime of the injected carrier, even following the turn off of the semiconductor optical amplifier.

The semiconductor optical amplifier 130 amplifies the pulse 152 received from the optical circulator 120, which has spectral content dictated by the master oscillator 110. However, the semiconductor optical amplifier 130 provides amplification over a broad range of wavelengths and as a result the first amplified pulse 153 includes amplified optical noise (broadband amplified spontaneous emission) as well as content from the received pulse 152. The system 100 therefore spectrally cleans the first amplified pulse 153 by directing the first amplified pulse to the fiber Bragg grating 140. The fiber Bragg grating 140 selectively reflects the first amplified pulse 153 according to its spectral content and generates a reflected pulse 154 with relatively less spectral noise than the first amplified pulse 153. The semiconductor optical amplifier 130 is optically connected to the fiber Bragg grating 140. The reflectivity of the first fiber Bragg grating 140 is preferably centered at approximately the wavelength of the initial pulse 151 that is output from the master oscillator 110. Stated differently, the first fiber Bragg grating 140 is highly reflective only within a narrow wavelength centered at the wavelength of the initial pulse 151 that is output from the master oscillator 110. Thus, selectively reflecting the first amplified pulse 153 from the fiber Bragg grating 140 to create the reflected pulse 154 spectrally cleans the output of the semiconductor optical amplifier 130.

While the system 100 is illustrated and described with the fiber Bragg grating 140 providing spectral conditioning by selectively reflecting the first amplified pulse 153 to create the reflected pulse 154 with desirable spectral characteristics, the present disclosure is not so limited. Alternative embodiments can be realized by replacing the fiber Bragg grating 140 with another optical device configured to selectively reflect incoming optical signals according to their spectral characteristics such that the resulting reflected signal is spectrally characterized. In particular, the reflected signal from any such selective reflector desirably substantially reflects wavelengths corresponding to the initial input pulse 151 while substantially not reflecting broadband amplified spontaneous emission introduced by the semiconductor optical amplifier 130. Such alternative optical devices can include, without limitation, a bulk grating, a dichroic mirror, an interferometric cavity and/or etalon configured to selectively transmit signals according to spectral characteristics via resonance effects, one or more filters and/or isolators in combination with a non-selective reflector, etc.

The reflected pulse 154 is transmitted back through the semiconductor optical amplifier 130, which is electronically switched on a second time according to the control signals 106 to create a second amplified pulse 155. The second amplified pulse 155 has a gain corresponding to two passes through the semiconductor optical amplifier 130. Thus, the second amplified pulse 155 is amplified relative to the incoming pulse 152 by approximately twice as many decibels as the first amplified pulse 153. For example, if the first amplified pulse 153 has a gain of approximately 20 dB, the second amplified pulse 155 has a gain of approximately 40 dB. The semiconductor optical amplifier 130 amplifies at least a portion of the reflected pulse 154 such that the second amplified pulse 155 has a duration less than or equal to the duration of the first amplified pulse 153 (i.e., the duration of the amplification window of the semiconductor optical amplifier 130).

The second amplified pulse 155 is directed to the intermediate port (port B) of the optical circulator 120 and passed to the output port (port D). An output pulse 156 is emitted from the optical circulator 120, providing the output of the pulse shaper 115. As will be discussed in connection with FIGS. 2A-2C, selecting the activation times of the semiconductor optical amplifier 130 allows for controlling the duration and/or shape of the output pulse 156.

Figure 2A:
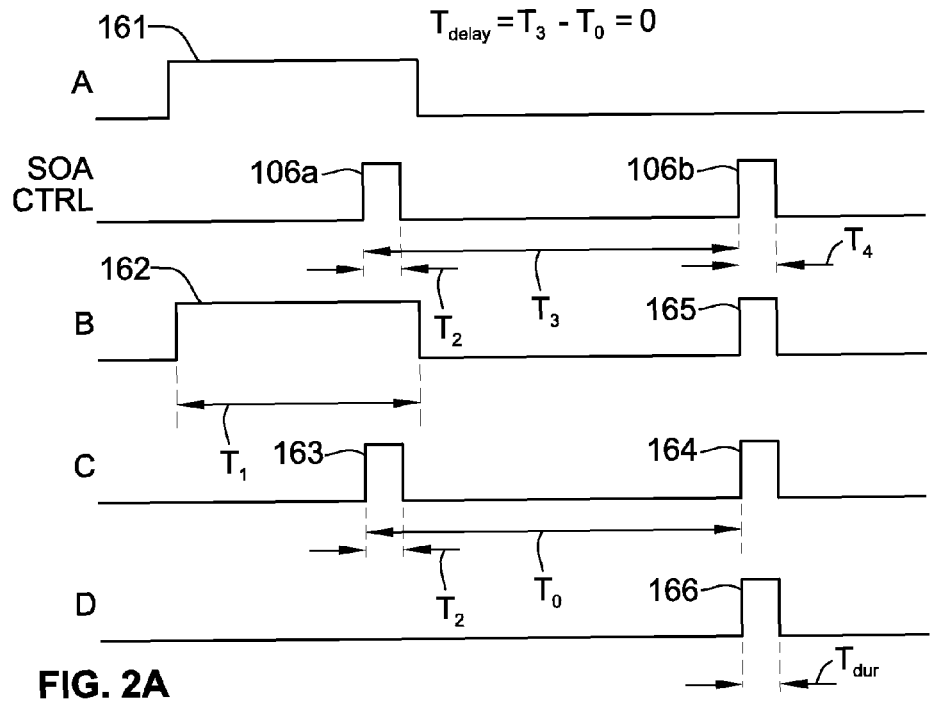
FIG. 2A is a timing diagram of optical signals generated via the system shown in FIG. 1, where the semiconductor optical amplifier is activated at zero relative time delay.
Figure 2B:
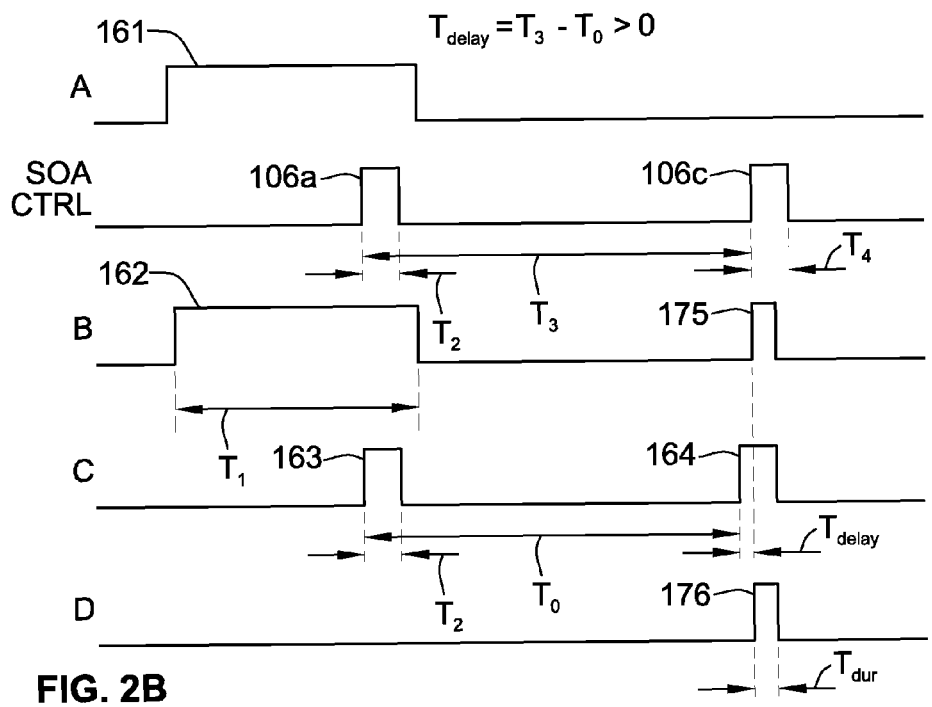
FIG. 2B is a timing diagram of optical signals generated via the system shown in FIG. 1, where the semiconductor optical amplifier is activated at a positive relative time delay.
Figure 2C:
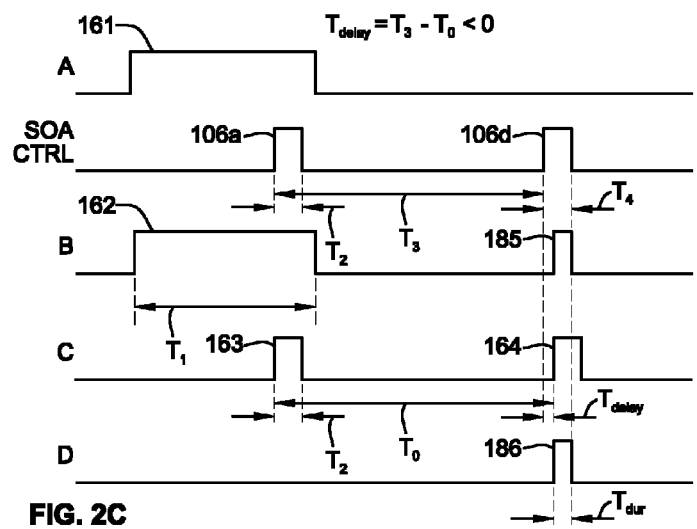
FIG. 2C is a timing diagram of optical signals generated via the system shown in FIG. 1, where the semiconductor optical amplifier is activated at a negative relative time delay.

FIGS. 2A-2C are representative timing diagrams for operation of the system 100 shown in FIG. 1. The timing diagrams of FIGS. 2A-2C illustrate both the control signals 106 operating the semiconductor optical amplifier 130 as well as optical signals at the points labeled A, B, C, and D in the optical pathway of the system 100. While the system 100 in FIG. 1 is shown with pulses 151, 152, 153, 154, 155, and 156, the timing diagrams in FIGS. 2A-2C include particular examples of such pulses, which are numbered 161, 162, 163, 164, 165, and 166, respectively. Generally, the exemplary pulses 161-166 correspond to the pulses 151-156, that is, the initial pulse 161 from the master oscillator provides a particular example of the initial pulse 151 described in connection with FIG. 1.

FIG. 2A is a timing diagram of optical signals generated via the system shown in FIG. 1, where the semiconductor optical amplifier 130 is activated at zero relative time delay. The timing diagram in FIG. 2A shows, at the line labeled "A", the amplitude of optical signals at port A of the optical circulator 120, which generally corresponds to the output from the master oscillator 110. The line labeled "SOA CTRL" shows the control signals 106 driving the semiconductor optical amplifier 130. When the SOA CTRL line is set high, the semiconductor optical amplifier 130 is turned on, and when the SOA CTRL line is set low, the semiconductor optical amplifier 130 is turned off. The line labeled "B" shows the amplitude of optical signals at port B of the optical circulator 120. The line labeled "C" shows the amplitude of optical signals at the port of the semiconductor optical amplifier 130 that is fiber-connected to the fiber Bragg grating 140. The line labeled "D" shows the amplitude of optical signals at the output of the system 100 (i.e., the signals emitted from port D of the optical circulator 120).

A first pulse 161 is generated by the master oscillator 110 and directed to the optical circulator 120. The optical circulator 120 conveys the received pulse 162 to the semiconductor optical amplifier 130. The first pulse 161 has duration $T_1$, which can be, for example, approximately 10 nanoseconds. The semiconductor optical amplifier 130 is turned on for a first amplification window by setting the control signal high (106a) to amplify a tail portion of the first pulse 161 that avoids the transients immediately following turn on of the master oscillator 110. The resulting amplified pulse 163 is directed from the semiconductor optical amplifier 130 to the fiber Bragg grating 140. A reflected pulse 164 returns to the semiconductor optical amplifier 130 as a spectrally cleaned version of the first amplified pulse 163.

The time required for the first amplified pulse 163 to travel from the semiconductor optical amplifier 130 (at point C) to the fiber Bragg grating 140, and be reflected back again is indicated by time $T_0$. Thus, the base time $T_0$ is the time required for an optical signal to complete a round trip along the optical path connecting the semiconductor optical amplifier 130 and the fiber Bragg grating 140. The time $T_0$ is a function of the optical path length in the fiber connection between the semiconductor optical amplifier 130 and the fiber Bragg grating 140.

The semiconductor optical amplifier 130 is turned on a second time to provide a second amplification window by setting the control signal high (106b). The second activation of the semiconductor optical amplifier 130 results in amplification of at least a portion of the reflected pulse 164 to generate a second amplified pulse 165. A time $T_3$ separates the initiation of the first activation (to generate the first amplified pulse 163) and the initiation of the second activation (to generate the second amplified pulse 165). The duration of the second amplification window is $T_4$, which can optionally be the same length as the duration $T_2$ as the first amplification window 106a. The second amplified pulse 165 is received at port B of the optical circulator 120 and an output pulse 166 with duration $T_{dur}$ is emitted from the system 100 via port D of the optical circulator 120.

In the present disclosure, a relative delay time $T_{delay}$ is defined as the difference between the time $T_3$ between the activations of the semiconductor optical amplifier 130 and the base time $T_0$. Thus, $T_{delay}=T_3-T_0$, and provides a measure of the timing of the successive activations of the semiconductor optical amplifier 130 relative to the optical path length between the semiconductor optical amplifier 130 and the fiber Bragg grating 140. A positive relative delay (achieved when $T_3>T_0$) indicates that the semiconductor optical amplifier 130 is activated the second time after the reflected pulse 164 reaches the semiconductor optical amplifier 130. An example of optical signals in the system 100 when operated with a positive relative delay ($T_{delay}>0$) is shown in FIG. 2B. A negative relative delay (achieved when $T_3<T_0$) indicates that the semiconductor optical amplifier 130 is activated the second time before the reflected pulse 164 reaches the semiconductor optical amplifier 130. An example of optical signals in the system 100 when operated with a negative relative delay ($T_{delay}<0$) is shown in FIG. 2C.

In FIG. 2A, an example is shown where the system 100 is operated to achieve zero relative delay ($T_{delay}=0$). Accordingly, in the timing diagram of FIG. 2A, the semiconductor optical amplifier 130 is activated just as the reflected pulse 164 reaches the semiconductor optical amplifier 130. Thus, the second amplification window 106b precisely overlaps with the arrival of the reflected pulse 164 at the semiconductor optical amplifier 130, and the gain of the second amplified pulse 165 is therefore approximately the square of the gain of the first amplified pulse 163 (i.e., on a logarithmic scale, the gain of the second amplified pulse 165 is double the gain of the first amplified pulse 163, reflecting two passes through the semiconductor optical amplifier 130). Setting the relative time delay to zero thus maximizes the amount of overlap between the amplification windows 106a, 106b, and accordingly maximizes the total power of the resulting output pulse 166 (see FIG. 5A).

FIG. 2B is a timing diagram of optical signals generated via the system shown in FIG. 1, where the semiconductor optical amplifier 130 is activated at a positive relative time delay (e.g., $T_{delay}>0$). In the embodiment of FIG. 2B, the second activation of the semiconductor optical amplifier 130 to provide the second amplification window 106c is initiated so the reflected pulse 164 reaches the semiconductor optical amplifier 130 prior to the turn on of the semiconductor optical amplifier 130. As a result, the second amplified pulse 175 generated by the semiconductor optical amplifier 130 is substantially formed only by the portion of the reflected pulse 164 that overlaps with the second amplification window 106c. In particular, the initial portion of the reflected pulse 164 is not amplified by the semiconductor optical amplifier 130 and therefore is substantially not perceivable in comparison to the second amplified pulse 175. For example, the initial portion of the reflected pulse 164 corresponding to the initial duration $T_{delay}=T_3-T_0$ of the reflected pulse 164 can be substantially not amplified by the second amplified pulse 175. Where the semiconductor optical amplifier 130 is configured to substantially block (e.g., absorb) incoming optical energy while turned off, rather than simply passively transmit incoming optical signals without amplification while turned off, the initial $T_{delay}$ portion of the reflected pulse 164 is substantially eliminated from the output of the semiconductor optical amplifier 130. The second amplified pulse 175 is passed to the optical circulator 120, and output pulse 176 is then output from the optical circulator 120.

FIG. 2C is a timing diagram of optical signals generated via the system shown in FIG. 1, where the semiconductor optical amplifier is activated at a negative relative time delay (e.g., $T_{delay}<0$). In the embodiment of FIG. 2C, the second activation of the semiconductor optical amplifier 130 to provide the second amplification window 188 is initiated so the reflected pulse 164 reaches the semiconductor optical amplifier 130 after the turn on of the semiconductor optical amplifier 130. Where the duration $T_4$ of the second amplification window 106d is similar to the duration $T_2$ of the reflected pulse 164, this causes the semiconductor optical amplifier 130 to turn off prior to the entire reflected pulse 164 reaching the semiconductor optical amplifier 130 to be amplified. As a result, the second amplified pulse 185 generated by the semiconductor optical amplifier 130 is substantially formed only by the portion of the reflected pulse 164 that overlaps with the second amplification window 106d. In particular, the tail portion of the reflected pulse 164 is not amplified by the semiconductor optical amplifier 130 and therefore is substantially not perceivable in comparison to the second amplified pulse 185. For example, $T_2=T_4$, the tail portion of the reflected pulse 164 with duration $T_{delay}=|T_3-T_0|$ is substantially not amplified because the semiconductor optical amplifier 130 is already turned off by the time the final portion of the reflected pulse 164 reaches the semiconductor optical amplifier 130. Where the semiconductor optical amplifier 130 is configured to substantially block (e.g., absorb) incoming optical energy while turned off, rather than simply passively transmit incoming optical signals without amplification while turned off, the final $T_{delay}$ portion of the reflected pulse 164 is substantially eliminated from the output of the semiconductor optical amplifier 130. The second amplified pulse 185 is passed to the optical circulator 120, and output pulse 186 is then output from the optical circulator 120.

The duration $T_{dur}$ of the output pulse 166 depends on the duration $T_4$ of the second amplification window, the duration $T_2$ of the first amplification window, the temporal separation $T_3$ between the first and second activations of the semiconductor optical amplifier 130, and the base time $T_0$ required for an optical signal to make a round trip between the semiconductor optical amplifier 130 and the fiber Bragg grating 140. Generally, then when $T_2=T_4$, $T_{dur}=T_4-|T_{delay}|=T_4-|T_3-T_0|$.

In some embodiments disclosed herein, an optical pulse is generated by sending a pulse through the semiconductor optical amplifier 130 twice while selecting the activation times of the semiconductor optical amplifier 130 such that the resulting output twice-amplified pulse (e.g., the output pulse 156) is shaped by the relative time delay between the first and second activations of the semiconductor optical amplifier 130. In some examples, allowing the pulse to perform a double pass of the semiconductor optical amplifier 130, allows the output pulse duration (e.g., $T_{dur}$) to not be limited by the inherent carrier lifetime of the semiconductor optical amplifier 130.

Thus, some embodiments disclosed herein address the technical problem of generating optical pulses of continuously adjustable duration in the range of approximately 100 picoseconds to approximately 400 picoseconds. Embodiments of the present disclosure are also suitable for generation of arbitrarily longer pulses up to and exceeding pulse durations of approximately 2 nanoseconds.

Figure 3A:
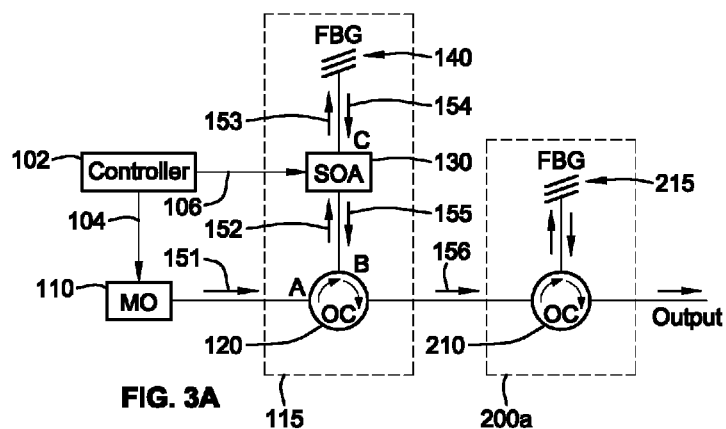
FIG. 3A is a block diagram of another system for generating an optical pulse that also includes a spectral conditioning system including a fiber Bragg grating.
Figure 3B:
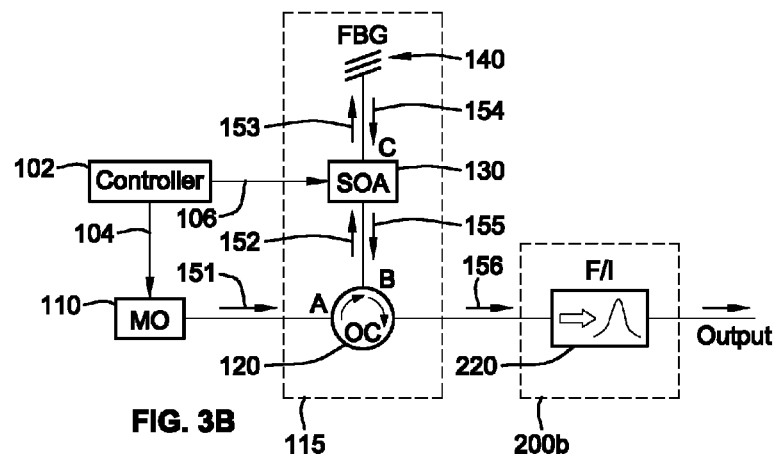
FIG. 3B is a block diagram of another system for generating an optical pulse similar to the system shown in FIG. 3A, but where the spectral conditioning system is a bandpass filter and isolator.

Some embodiments disclosed herein provide an adjustable system for generating an optical pulse with a high degree of control over the spectral and temporal characteristics of the generated output pulse. FIGS. 3A-3B, described next, provide exemplary spectral conditioning systems that can be employed in combination with the pulse shaping system 100 of FIG. 1 to further tune the resulting output pulse.

FIG. 3A is a block diagram of another system for generating an optical pulse that also includes a spectral conditioning system 200a including a second fiber Bragg grating 215. The output of the first optical circulator 120 is optically connected to an input port of a second optical circulator 210. The output pulse 156 is directed to an input port of a second optical circulator 210. The second optical circulator 210 is similar to the first optical circulator 120 and includes an input port, an intermediate port, and an output port. Optical signals received at the input port are directed to be output from the intermediate port and optical signals received at the intermediate port are directed to be output from the output port. The intermediate port of the second optical circulator 210 is optically connected to the second fiber Bragg grating 215 to direct optical signals to the second fiber Bragg grating 215 and receive returning signals reflected therefrom.

The second optical circulator 210 directs the pulse to the second fiber Bragg grating 215. The pulse is selectively reflected from the second fiber Bragg grating 215 according to its spectral content such that the reflected optical signal has a spectral profile dependent on the reflectivity profile of the second fiber Bragg grating. For example, the second fiber Bragg grating 215 can be configured with a reflectivity approximately centered on the wavelength emitted from the master oscillator 110, similar to the first fiber Bragg grating 140. The optical pulse reflected from the second fiber Bragg grating is thus a spectrally cleaned version of the output pulse 156, and effectively strips out broadband amplified spontaneous emission added to the second amplified pulse 155 (and also the output pulse 156) during the second pass through the semiconductor optical amplifier 130. The portion of the output pulse 156 selectively reflected from the second fiber Bragg grating 215 is then conveyed to the output port of the second optical circulator 210 to provide the output of the system. The spectral conditioning system 200a thus spectrally cleans the output pulse 156 from the pulse shaper 115 by directing the output pulse 156 to the second fiber Bragg grating 215.

FIG. 3B is a block diagram of another system for generating an optical pulse similar to the system shown in FIG. 3A, but where the spectral conditioning system 200b is a bandpass filter and isolator 220. In the system shown in FIG. 3B, the output of the optical circulator 120 is optically connected to the bandpass filter and isolator 220, which selectively transmits optical signals according to the spectral responsiveness of the bandpass filter and isolator 220. The bandpass filter and isolator 220 can include an optical bandpass filter and an optical isolator. The bandpass filter can be a passive device that transmits wavelengths within a desired range and attenuates frequencies outside the range. For example, the bandpass filter can be selected to have a transmission spectrum approximately centered on the output wavelength of the master oscillator 110. The optical isolator allows the transmission of light in only one direction. For example, the output of the optical bandpass filter can be directed to the optical isolator to allow transmission of light only in the direction of the output pulse 156, that is only signals conveyed from the output of the optical circulator 120. The optical isolator thereby prevents unwanted feedback from entering the pulse shaper 115 from downstream optical devices.

Accordingly, the bandpass filter and isolator 220 spectrally cleans the output pulse 156 by selectively transmitting wavelengths corresponding to the initial input pulse 151 from the master oscillator 110 and substantially removing the broadband amplified spontaneous emission introduced by the semiconductor optical amplifier 130. The transmitted portion of the output pulse 156 passing through the bandpass filter and isolator 220 thus provides a spectrally tuned output of the system of FIG. 2B.

Figure 3C:
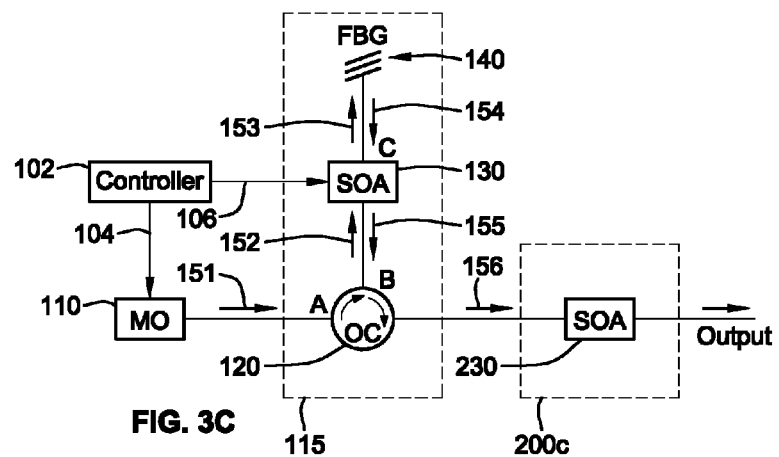
FIG. 3C is a block diagram of another system for generating an optical pulse similar to the system shown in FIG. 1, but also including a second semiconductor optical amplifier to further shape the output pulse.

FIG. 3C is a block diagram of another system for generating an optical pulse similar to the system shown in FIG. 1, but also including a second semiconductor optical amplifier 230 to further shape the output pulse 156. The second semiconductor optical amplifier 230 is optically connected to the output of the optical circulator 120. The second semiconductor optical amplifier 230 is electronically driven to provide gain to input signals while turned on. For example, the second semiconductor optical amplifier 230 can be driven to provide an amplification window that amplifies at least a portion of the output pulse 156 by setting the second semiconductor optical amplifier 230 to be turned on while at least a portion of the output pulse 156 reaches the second semiconductor optical amplifier 230. The timing of the initiation of the amplification window provided by the second semiconductor optical amplifier 230 is thus dependent upon the optical path lengths between the first semiconductor optical amplifier 130 (from which the second amplified pulse emerges) and the second semiconductor optical amplifier 230. By initiating the amplification window with a suitable relative delay sufficient to amplify only a front portion (initial portion) or tail portion (subsequent portion) of the output pulse 156, while not amplifying (or even substantially blocking/absorbing) the remaining content of the output pulse, the second semiconductor optical amplifier can further shape the temporal amplitude variation of the optical signal passed to the output of the system. Thus, the second semiconductor optical amplifier 230 can be considered a second stage pulse shaper 200c.

The post-processing configurations shown in FIGS. 3A-3C to spectrally clean the output of the pulse shaper 115 (e.g., the spectral conditioners 200a, 200b in FIGS. 2A and 2B) or provide further pulse shaping (e.g., the second stage pulse shaper 200c in FIG. 2C) are illustrated separately for clarity, but can be combined together in some embodiments. For example, the output of the pulse shaper 115 can be passed through the second stage pulse shaper 200c to further shape the amplitude versus time of the resulting pulse, and the output of the second stage pulse shaper 200c can be directed through one of the spectral conditioning systems 200a or 200b to spectrally clean the resulting pulse and remove broadband optical noise due to, for example, amplified spontaneous emission.

Figure 4A:
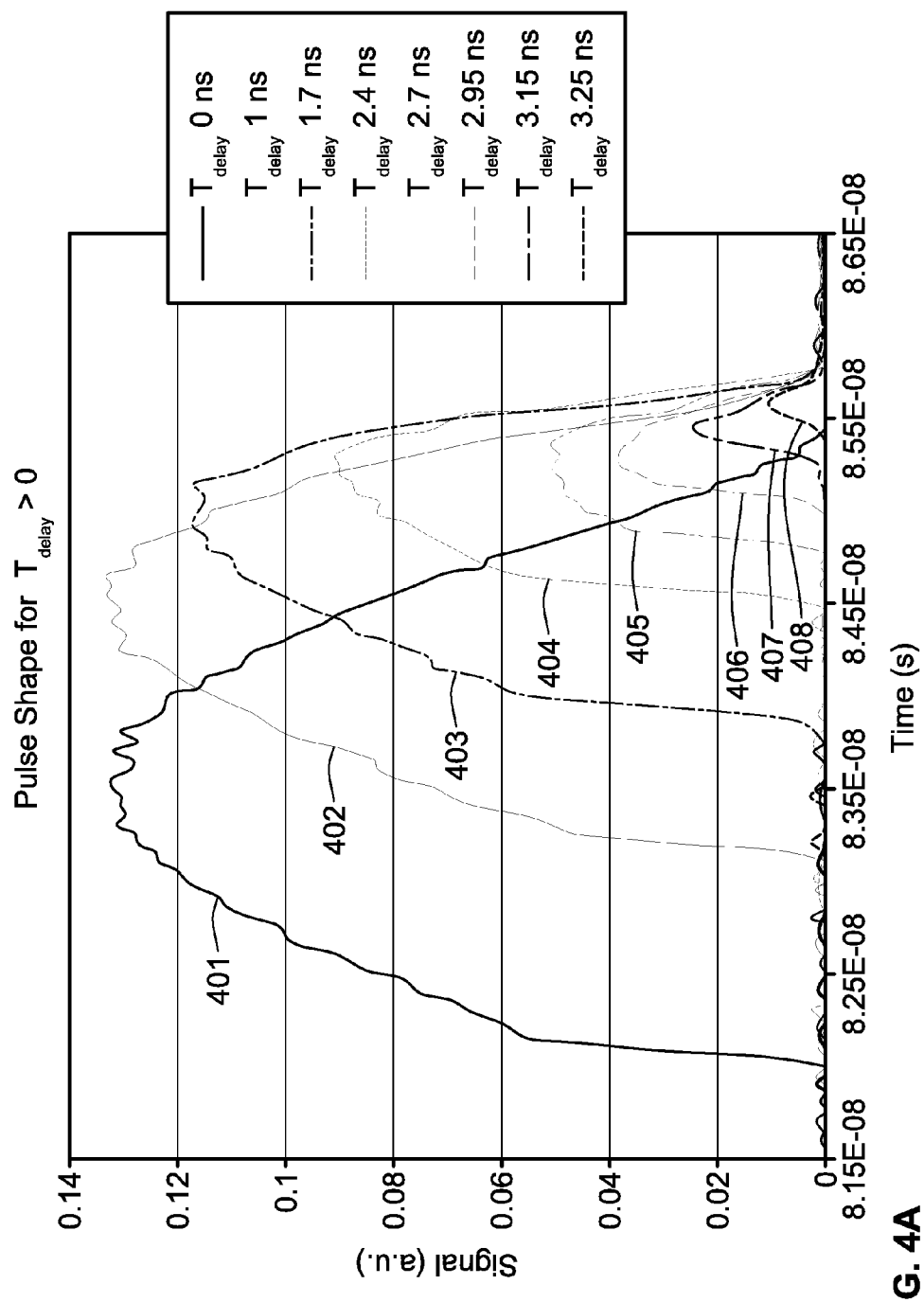
FIG. 4A is a graph of eight representative pulses generated with positive relative time delays.

FIG. 4A is a graph of eight representative pulses generated with positive relative time delays. The curves show amplitude as a function of time in arbitrary units for pulses generated using representative positive relative time delay values by the system shown in FIG. 3A. Curve 401 is generated with $T_{delay}$=0.0 ns; curve 402 is generated with $T_{delay}$=1.0 ns; curve 403 is generated with $T_{delay}$=1.7 ns; curve 404 is generated with $T_{delay}$=2.4 ns; curve 405 is generated with $T_{delay}$=2.7 ns; curve 406 is generated with $T_{delay}$=2.95 ns; curve 407 is generated with $T_{delay}$=3.15 ns; and curve 408 is generated with $T_{delay}$=3.25 ns. The pulse shapes shown in the curves 401-408 are influenced by the selection of the value of $T_{delay}$. For example, the pulse shape for a 0.0 nanosecond delay has a total duration of approximately $(8.55-8.2) \times 10^{-8}$ seconds, that is, 3.5 nanoseconds. The pulse shape for a 3.25 nanosecond delay has a total width of approximately $(8.58-8.53) \times 10^{-8}$ seconds, that is, 0.5 nanoseconds or 500 picoseconds.

Figure 4B:
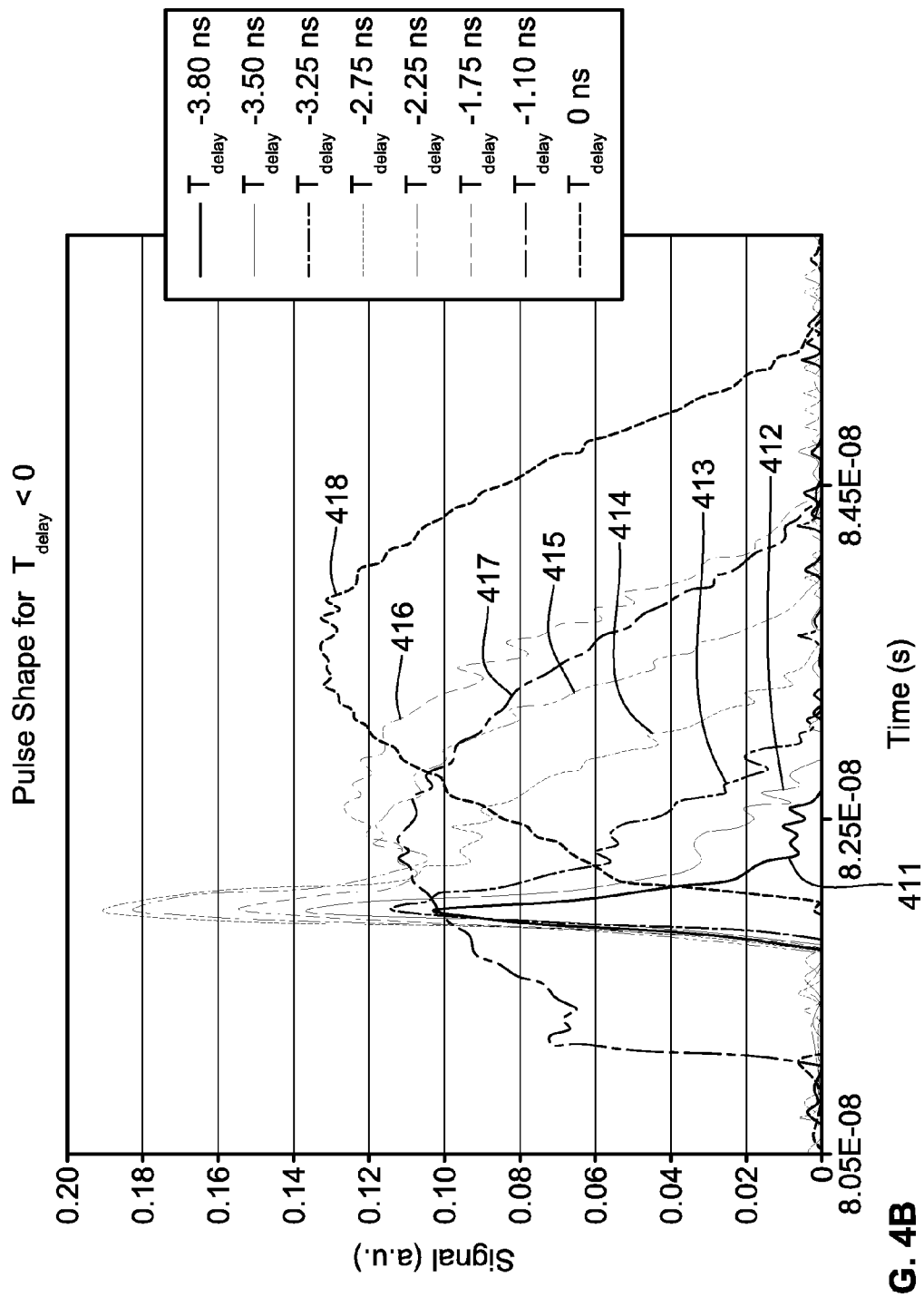
FIG. 4B is a graph of eight representative pulses generated with negative relative time delays.

FIG. 4B is a graph of eight representative pulses generated with negative relative time delays. The curves show amplitude as a function of time in arbitrary units for pulses generated using representative negative relative time delay values by the system shown in FIG. 3A. Curve 411 is generated with $T_{delay}$=−3.8 ns; curve 412 is generated with $T_{delay}$=−1.1 ns; curve 413 is generated with $T_{delay}$=−1.75 ns; curve 414 is generated with $T_{delay}$=−2.25 ns; curve 415 is generated with $T_{delay}$=−2.75 ns; curve 416 is generated with $T_{delay}$=−3.25 ns; curve 417 is generated with $T_{delay}$=−3.5 ns; and curve 418 is generated with $T_{delay}$=−3.8 ns. Again, the pulse shapes are similar for different values of the delay, with the pulse shape for a −3.8 nanosecond delay having a total width of approximately $(8.27-8.19) \times 10^{-8}$ seconds, that is, 0.8 nanoseconds or 800 picoseconds. The pulse shape for a 0.0 nanosecond delay again has a total width of approximately $(8.55-8.2) \times 10^{-8}$ seconds, that is, 3.5 nanoseconds.

The pulses with relatively large negative delays of approximately −1.75 ns and beyond are influenced by energy storage within the semiconductor optical amplifier 130 due to activation prior to arrival of the signal to be amplified. Upon arrival of the signal to be amplified (e.g., the reflected pulse 154), the stored energy is released, resulting in the peaks shown in FIG. 4B. Storage lifetimes in semiconductor optical amplifiers are typically 1-2 ns, so such effects are exhibited at negative relative delays greater than the typical storage lifetime.

The representative pulses shown in FIGS. 4A and 4B show that the system 100 can be operated to provide output pulses with continuously adjustable durations between approximately 3.5 ns (e.g., the curve 401 in FIG. 4A for $T_{delay}$=0) and approximately 200 picoseconds (e.g., the curve 408 in FIG. 4A for $T_{delay}$=3.25 ns). As noted elsewhere, durations of approximately 100 picoseconds are also achievable by proper selection of $T_{delay}$. In particular, the system 100 allows for shaping pulses with continuously adjustable durations between approximately 100 picoseconds and approximately 400 picoseconds.

The curves shown in FIGS. 4A and 4B also illustrate representative rise times and fall times of the resulting pulses. As noted above, the rise time is typically driven by stimulated emission while the fall time is typically dictated by the injected carrier lifetime. For example, a typical rise time may be between approximately 0.1 nanoseconds and 1.0 nanoseconds and a typical fall time may be between approximately 1 nanosecond and approximately 3 nanoseconds, as can be directly observed in FIGS. 4A and 4B.

Figure 5A:
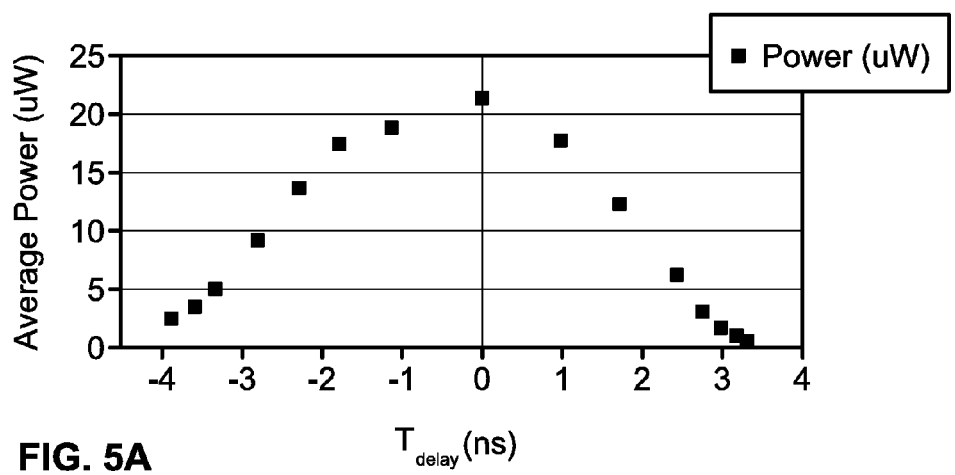
FIG. 5A is a graph showing a plot of output pulse average power as a function of relative time delay for pulses generated via the system shown in FIG. 3A.

FIG. 5A is a graph showing a plot of output pulse average power as a function of relative time delay for pulses generated via the system shown in FIG. 3A. More specifically, FIG. 5A is a graph showing a plot of the average power in microWatts (μW) as a function of relative time delay in nanoseconds, for the exemplary pulse shaping system via double-pass through semiconductor optical amplifier and including a spectral conditioner as shown in FIG. 3A.

Figure 5B:
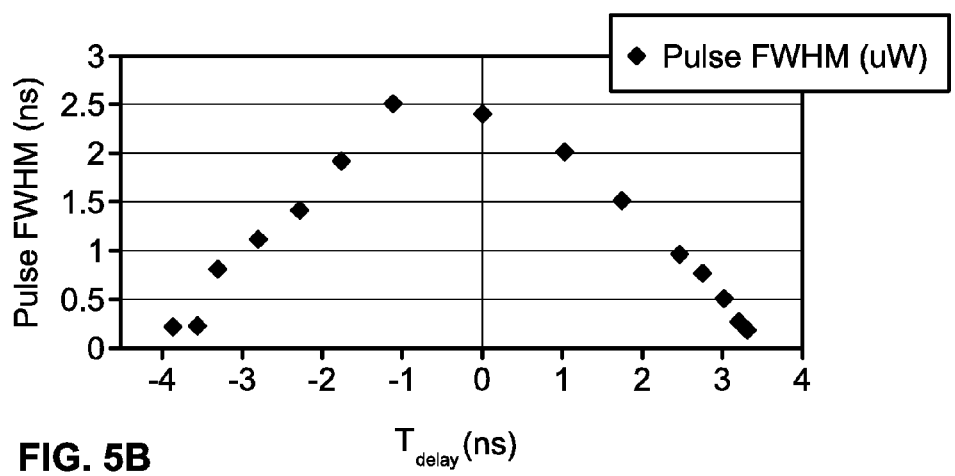
FIG. 5B is a graph showing a plot of output pulse full width at half maximum values as a function of relative time delay for pulses generated via the system shown in FIG. 3A.

FIG. 5B is a graph showing a plot of output pulse full width at half maximum values as a function of relative time delay for pulses generated via the system shown in FIG. 3A. More specifically, FIG. 5B is a graph showing a plot of pulse full width at half maximum in nanoseconds as a function of relative time delay in nanoseconds, for the exemplary pulse shaping system via double-pass through semiconductor optical amplifier and including a spectral conditioner as shown in FIG. 3A.

Table 1 displays the data plotted in FIGS. 5A and 5B.

TABLE 1

| Absolute Delay (ns) | Relative Delay (ns) (negative indicates SOA fired early) | Pulse FWHM (ns) | Power (μW) |
|---|---|---|---|
| 15.2 | −3.8 | 0.206 | 2.3 |
| 15.5 | −3.5 | 0.22 | 3.4 |

TABLE 1-continued

| Absolute Delay (ns) | Relative Delay (ns) (negative indicates SOA fired early) | Pulse FWHM (ns) | Power (µW) |
|---|---|---|---|
| 15.75 | −3.25 | 0.8 | 5 |
| 16.25 | −2.75 | 1.1 | 9.1 |
| 16.75 | −2.25 | 1.4 | 13.5 |
| 17.25 | −1.75 | 1.9 | 17.4 |
| 17.9 | −1.1 | 2.5 | 18.8 |
| 19 | 0 | 2.4 | 21.3 |
| 20 | 1 | 2 | 17.7 |
| 20.7 | 1.7 | 1.5 | 12.3 |
| 21.4 | 2.4 | 0.95 | 6.1 |
| 21.7 | 2.7 | 0.75 | 3 |
| 21.95 | 2.95 | 0.5 | 1.5 |
| 22.15 | 3.15 | 0.25 | 0.77 |
| 22.25 | 3.25 | 0.175 | 0.45 |

Figure 6:
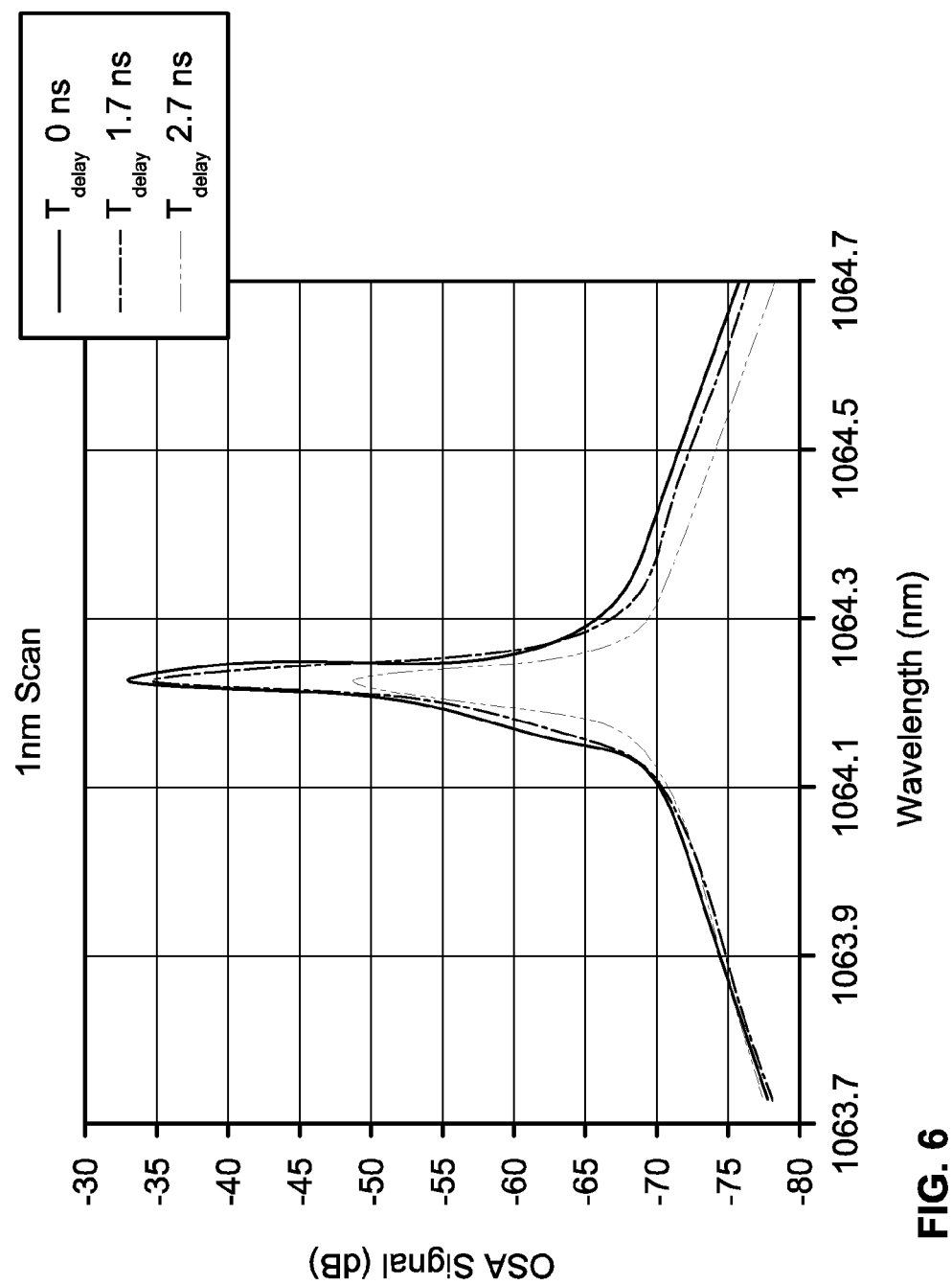
FIG. 6 is a graph showing a plot of the signal amplitude as a function of wavelength over a one nanometer range for eight positive values of relative time delay.

By combining the pulse shaper 115 with the spectral conditioner 200a, as shown in the system of FIG. 3A, both the spectral and temporal amplitude profile can be controlled. In some embodiments, the output pulse has an amplitude versus time profile that is adjustable by selection of the $T_{delay}$ value. In particular, the resulting output pulse has a continuously adjustable duration from 100 picoseconds to 1000 picoseconds, as shown in the representative curves of FIG. 4A. Exemplary spectral profiles of output pulses at various time delay values are shown in FIG. 6. The spectral profiles demonstrate the narrow wavelength selection achievable with the spectral conditioning system 200a to filter out broadband optical noise introduced by the semiconductor optical amplifier 130. Thus, the spectral profiles shown in FIG. 6 illustrate the selective reflectivity of the fiber Bragg grating 215 in FIG. 3A (and also the fiber Bragg grating 140 in FIG. 1). Although, it is understood that the spectral profiles can also be achieved by similar spectrally-selective reflectors and/or filters, such as the bandpass filter and isolator 220 in FIG. 3B.

In some examples, the resulting spectral power density of the output pulse is characterized by a wavelength range of less than 0.5 nm, such as a spectral density with a full width at half maximum value (FWHM) of approximately 0.45 nm. Thus, in some examples, where the output pulse is centered at approximately 1064 nm, the pulse can have a wavelength of approximately 1064±0.22 nm. The various spectral conditioning systems and spectrally-selective reflectors, such as fiber Bragg gratings, included in the pulse generation and tuning systems described herein therefore can have correspondingly selective reflectivity and/or transmissivity responsiveness to provide an output pulse with FWHM of approximately 0.45 nm.

FIG. 6 is a graph showing a plot of the signal amplitude as a function of wavelength over a one nanometer range for exemplary positive values of relative time delay. As shown in FIG. 6, the spectral selectivity of the system (e.g., due to the reflectivity of the fiber Bragg grating) is substantially independent of the value of the time delay selected. While the peak spectral density generally decreases at greater values of time delay (due to relatively less overlap in the amplification windows), the general form of the power spectral density is independent of the relative time delay. For example, the FWHM of the spectral profile of the output pulse is approximately 0.45 to 0.50 nm, and centered at approximately the same center wavelength, for the profiles generated using $T_{delay}$=0 ns, $T_{delay}$=1.7 ns, and $T_{delay}$=2.7 ns.

Figure 7:
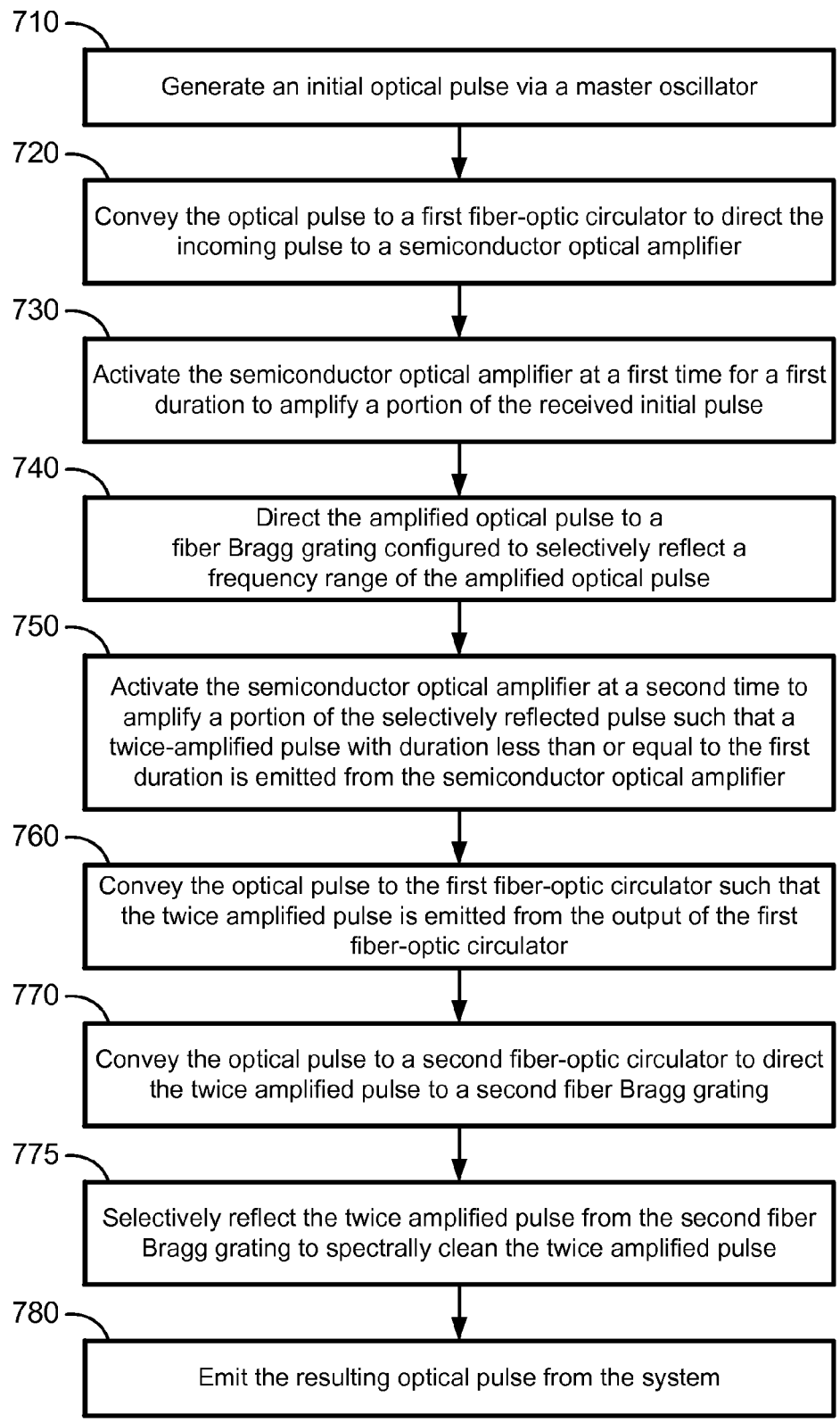
FIG. 7 is a flowchart of a method for generating an optical pulse with a pulse-format of interest based on a double-pass semiconductor optical amplifier and spectral conditioning system including a fiber Bragg grating, such as the system of FIG. 3A.

FIG. 7 is a flowchart of a method for generating an optical pulse with a pulse-format of interest via two passes through a semiconductor optical amplifier and a spectral conditioning system including a fiber Bragg grating, such as the system shown in FIG. 3A. The discussion of the method shown by the flowchart of FIG. 7 includes references to the various optical devices in FIG. 3A. An initial optical pulse 151 is generated via a master oscillator (710). The initial optical pulse 151 is conveyed to a first fiber-optic circulator 120 to direct the pulse 152 to a semiconductor optical amplifier 130 (720). The semiconductor optical amplifier 130 is activated at a first time, via control signals 130, for a first duration to amplify a portion of the received pulse 152 (730). As noted elsewhere, the timing of the first activation can be selected to amplify only a tail portion of the initial pulse 151 with spectral and amplitude characteristics substantially free of any initial transients in the initial pulse 151 immediately following turn on of the master oscillator 110. The first amplified optical pulse 153 is directed to a fiber Bragg grating 140 configured to selectively reflect a spectral range of the amplified pulse 153 (740). The semiconductor optical amplifier 130 is activated at a second time, via control signals 130, to amplify a portion of the selectively reflected pulse 154 such that a twice-amplified pulse 155 with duration less than or equal to the duration of the fist amplified pulse 153 is emitted from the semiconductor optical amplifier 130 (750). The twice amplified optical pulse 155 is directed to the first fiber-optic circulator 120 such that the twice amplified pulse 155 is emitted from the output of the first fiber-optic circulator 120 (760). The output pulse 156 is conveyed to a second fiber-optic circulator 210 to direct the twice amplified pulse to a second fiber Bragg grating 215 (770). The twice amplified pulse 156 is selectively reflected from the second fiber Bragg grating 215 to spectrally clean the pulse by substantially removing broadband optical noise introduced by the semiconductor optical amplifier 130 (775). The resulting optical pulse is emitted from the system (780).

Figure 8:
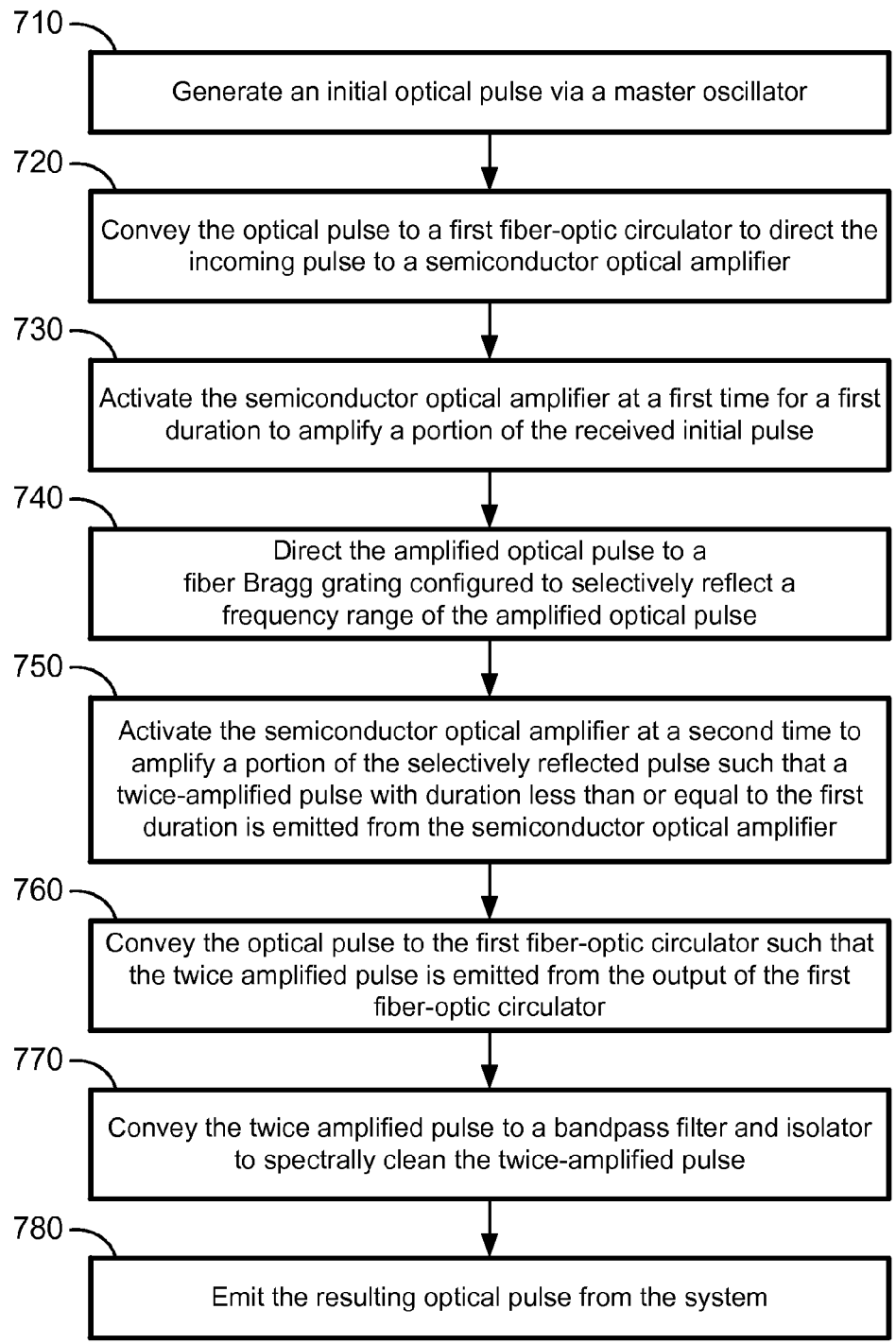
FIG. 8 is a flowchart of a method for generating an optical pulse with a pulse-format of interest based on a double-pass semiconductor optical amplifier and spectral conditioning system including a bandpass filter and isolator, such as the system of FIG. 3B.

FIG. 8 is a flowchart of a method for generating an optical pulse with a pulse-format of interest based on a double-pass semiconductor optical amplifier and spectral conditioning system including a bandpass filter and isolator, such as the system shown in FIG. 3B. The discussion of the method shown by the flowchart of FIG. 8 includes references to the various optical devices in FIG. 3B. An initial optical pulse 151 is generated via a master oscillator (710). The initial optical pulse 151 is conveyed to a first fiber-optic circulator 120 to direct the pulse 152 to a semiconductor optical amplifier 130 (720). The semiconductor optical amplifier 130 is activated at a first time, via control signals 130, for a first duration to amplify a portion of the received pulse 152 (730). As noted elsewhere, the timing of the first activation can be selected to amplify only a tail portion of the initial pulse 151 with spectral and amplitude characteristics substantially free of any initial transients in the initial pulse 151 immediately following turn on of the master oscillator 110. The first amplified optical pulse 153 is directed to a fiber Bragg grating 140 configured to selectively reflect a spectral range of the amplified pulse 153 (740). The semiconductor optical amplifier 130 is activated at a second time, via control signals 130, to amplify a portion of the selectively reflected pulse 154 such that a twice-amplified pulse 155 with duration less than or equal to the duration of the fist amplified pulse 153 is emitted from the semiconductor optical amplifier 130 (750). The twice amplified optical pulse 155 is directed to the first fiber-optic circulator 120 such that the twice amplified pulse 155 is emitted from the output of the first fiber-optic circulator 120 (760). The twice amplified pulse 156 is conveyed to a bandpass filter and isolator 220 to spectrally clean the twice-amplified pulse 156 by substantially removing broadband optical noise introduced by the semiconductor optical amplifier 130 (870). The resulting optical pulse is emitted from the system (780).

Figure 9:
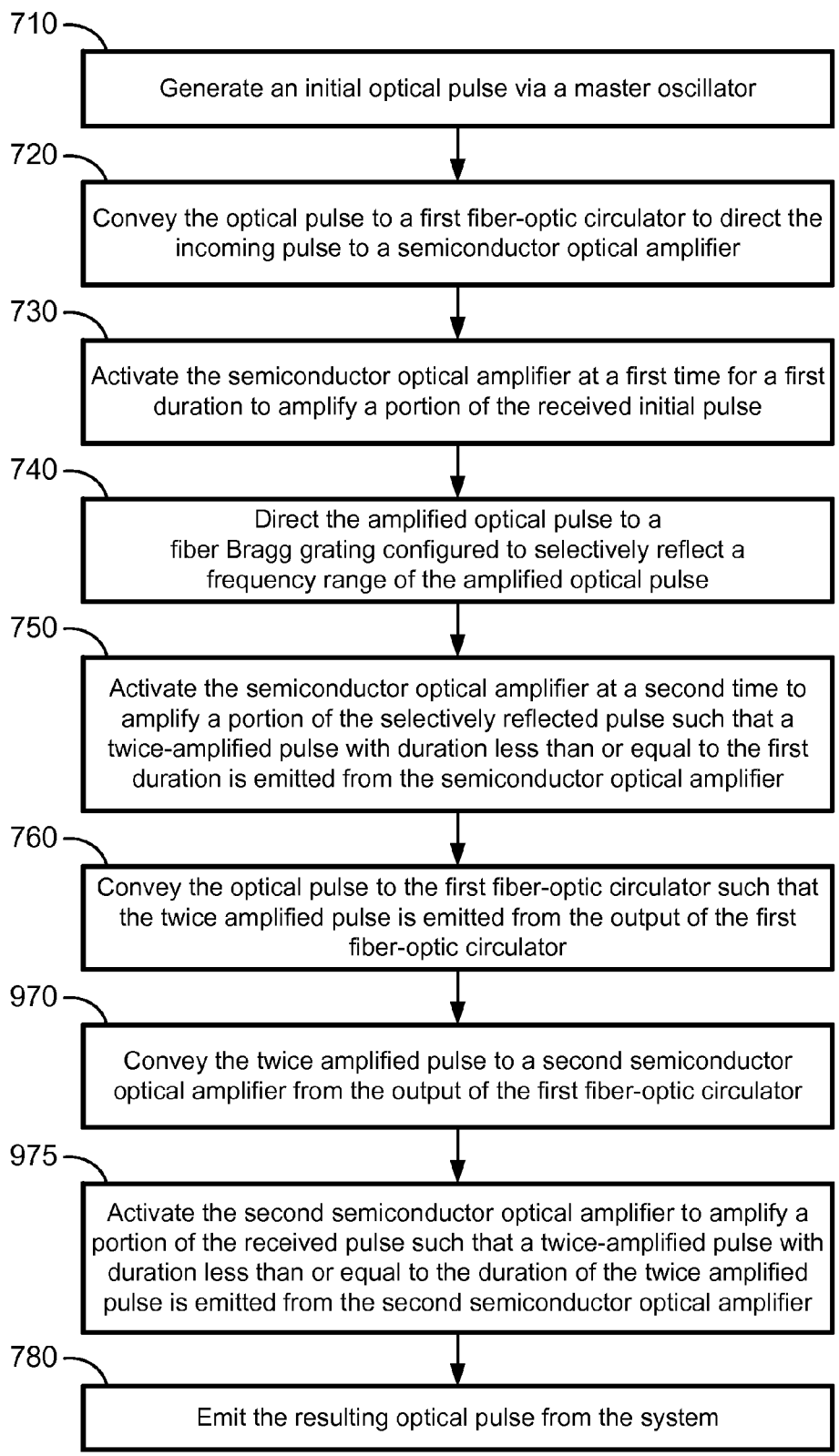
FIG. 9 is a flowchart of a method for generating an optical pulse with a pulse-format of interest based on a double-pass semiconductor optical amplifier and a second semiconductor optical amplifier, such as the system of FIG. 3C.

FIG. 9 is a flowchart of a method for generating an optical pulse with a pulse-format of interest based on a double-pass semiconductor optical amplifier and a second semiconductor optical amplifier, such as the system shown in FIG. 3C. The discussion of the method shown by the flowchart of FIG. 9 includes references to the various optical devices in FIG. 3B. An initial optical pulse 151 is generated via a master oscillator (710). The initial optical pulse 151 is conveyed to a first fiber-optic circulator 120 to direct the pulse 152 to a semiconductor optical amplifier 130 (720). The semiconductor optical amplifier 130 is activated at a first time, via control signals 130, for a first duration to amplify a portion of the received pulse 152 (730). As noted elsewhere, the timing of the first activation can be selected to amplify only a tail portion of the initial pulse 151 with spectral and amplitude characteristics substantially free of any initial transients in the initial pulse 151 immediately following turn on of the master oscillator 110. The first amplified optical pulse 153 is directed to a fiber Bragg grating 140 configured to selectively reflect a spectral range of the amplified pulse 153 (740). The semiconductor optical amplifier 130 is activated at a second time, via control signals 130, to amplify a portion of the selectively reflected pulse 154 such that a twice-amplified pulse 155 with duration less than or equal to the duration of the fist amplified pulse 153 is emitted from the semiconductor optical amplifier 130 (750). The twice amplified optical pulse 155 is directed to the first fiber-optic circulator 120 such that the twice amplified pulse 155 is emitted from the output of the first fiber-optic circulator 120 (760). The twice amplified pulse 156 is conveyed to a second semiconductor optical amplifier 230 from the output of the first fiber-optic circulator 120 (970). The second semiconductor optical amplifier 230 is activated to amplify a portion of the received pulse 156 such that a thrice-amplified pulse with duration less than or equal to the duration of the twice-amplified pulse 156 is emitted from the second semiconductor optical amplifier 230 (975). The resulting optical pulse is emitted from the system (780).

According to embodiments of the present disclosure, all components are optically connected via fiber-optic connections using fusion splices.

Some embodiments of the present disclosure achieve pulse carving by means of external temporal modulation. By mapping electrical signals from the controller 102 onto optical pulses, embodiments of the present disclosure provide support for generation of pulses with an adjustable pulsewidth (duration) and/or profile.

Some embodiments of the present disclosure are implemented using an electro-optic modulator. For example, embodiments can employ a resonant modulator, an interferometric modulator, and/or another voltage controlled device that can operate at low voltages.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the appended claims. Moreover, fabrication details are merely exemplary; the invention is defined by the following claims.

What is claimed is:

1. A method of generating a shaped optical pulse, the method comprising:
    generating a first optical pulse via a master oscillator;
    activating, at a first time, a semiconductor optical amplifier receiving the first optical pulse so as to amplify at least a portion of the first optical pulse and thereby produce a first amplified pulse;
    reflecting the first amplified pulse from a reflector such that a spectrally characterized reflected pulse is produced; and
    activating, at a second time, the semiconductor optical amplifier so as to amplify at least a portion of the spectrally characterized reflected pulse and thereby produce the shaped optical pulse.

2. The method according to claim 1, wherein the first time and the second time are separated by a time delay sufficient to control a duration of the shaped optical pulse, and wherein the time delay is greater than a base time required for an optical signal to make a round trip via an optical path connecting the semiconductor optical amplifier and the reflector.

3. The method according to claim 1, wherein the first time and the second time are separated by a time delay sufficient to control a duration of the shaped optical pulse, and
    wherein the time delay is less than a base time required for an optical signal to make a round trip via an optical path connecting the semiconductor optical amplifier and the reflector.

4. The method according to claim 1, further comprising:
    responsive to the activating, conveying the shaped optical pulse to a spectral conditioning system via one or more optical circulators, wherein the spectral conditioning system includes at least one of a fiber Bragg grating or a filter configured to selectively reflect or transmit incoming optical energy at wavelengths centered approximately at the wavelength of the first pulse from the master oscillator.

5. The method according to claim 1, further comprising:
    responsive to the activating, conveying the shaped optical pulse to a second semiconductor optical amplifier via one or more optical circulators; and
    activating, at a third time, the second semiconductor optical amplifier so as to amplify at least a portion of the shaped optical pulse and thereby produce a second shaped pulse.

6. The method according to claim 1, wherein the first pulse has a first duration that includes an initial period and a subsequent period, wherein at least one of a spectral variation or a power variation of the first pulse has a greater temporal uniformity during the subsequent period than during the initial period, and wherein the first time is selected to activate the semiconductor optical amplifier to produce the first amplified pulse by amplifying a portion of the first pulse that substantially includes the subsequent period of the first pulse such that the first amplified pulse is substantially free of contributions from the initial period of the first pulse.

* * * * *